United States Patent
Han et al.

(10) Patent No.: US 12,094,977 B2
(45) Date of Patent: Sep. 17, 2024

(54) DISPLAY DEVICE

(71) Applicant: Samsung Display Co., LTD., Yongin-si (KR)

(72) Inventors: Ji Hye Han, Seoul (KR); Jung Yun Jo, Namyangju-si (KR); Chul Min Bae, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/109,301

(22) Filed: Feb. 14, 2023

(65) Prior Publication Data
US 2023/0197853 A1   Jun. 22, 2023

Related U.S. Application Data

(63) Continuation of application No. 17/149,164, filed on Jan. 14, 2021, now Pat. No. 11,588,053.

(30) Foreign Application Priority Data

May 12, 2020   (KR) .................. 10-2020-0056279

(51) Int. Cl.
  *H01L 27/12*   (2006.01)
  *H01L 29/786*   (2006.01)
  *H10K 59/121*   (2023.01)

(52) U.S. Cl.
  CPC .... *H01L 29/78606* (2013.01); *H01L 27/1225* (2013.01); *H10K 59/1213* (2023.02)

(58) Field of Classification Search
  CPC . H01L 27/1225; H01L 27/1218; H01L 27/12; H01L 27/1262; H01L 29/7869;
(Continued)

(56) References Cited

U.S. PATENT DOCUMENTS 9,614,092 B2   4/2017   Jo et al.
9,905,800 B2   2/2018   Kim et al.
(Continued)

FOREIGN PATENT DOCUMENTS

KR   10-2010-0045912   5/2010
KR   10-2016-0108712   9/2016
(Continued)

OTHER PUBLICATIONS

H. Huang et al., Effect of Deposition Conditions on Mechanical Properties of Low-Temperature PECVD Silicon Nitride Films, Materials Science and Engineering A, Nov. 5, 2006, pp. 453-459, vols. 435-436.
(Continued)

*Primary Examiner* — Nikolay K Yushin
(74) *Attorney, Agent, or Firm* — KILE PARK REED & HOUTTEMAN PLLC

(57) ABSTRACT

A display device includes a buffer layer disposed on a substrate and comprising a first buffer film, and a second buffer film, wherein the first buffer film and the second buffer film are sequentially stacked in a thickness direction of the display device; a semiconductor pattern disposed on the buffer layer; a gate insulating layer disposed on the semiconductor pattern; and a gate electrode disposed on the gate insulating layer, wherein the first buffer film and the second buffer film comprise a same material, and a density of the first buffer film is greater than a density of the second buffer film.

24 Claims, 22 Drawing Sheets

(58) Field of Classification Search
CPC ......... H01L 29/78633; H01L 29/78606; H01L 29/78603; H01L 29/786; H01L 29/66969; H10K 50/8426; H10K 50/842; H10K 50/85; H10K 59/1213; H10K 59/126; H10K 59/123; H10K 59/124; H10K 59/121

See application file for complete search history.

(56) References Cited

U.S. PATENT DOCUMENTS

| | | |
|---|---|---|
| 10,020,352 B2 | 7/2018 | Chung et al. |
| 11,201,235 B2 | 12/2021 | Kamada |
| 11,765,935 B2 * | 9/2023 | Cho .................. H10K 59/1213 257/40 |
| 2014/0061632 A1 * | 3/2014 | Lee .................... H01L 27/1225 257/43 |
| 2016/0197197 A1 | 7/2016 | Jo et al. |
| 2017/0104048 A1 | 4/2017 | Chung et al. |
| 2020/0161464 A1 | 5/2020 | Kamada |
| 2021/0005693 A1 * | 1/2021 | Cho .................. H10K 59/1201 |

FOREIGN PATENT DOCUMENTS

| | | |
|---|---|---|
| KR | 10-2017-0034318 | 3/2017 |
| KR | 10-2017-0043726 | 4/2017 |

OTHER PUBLICATIONS

W. A. P. Claassen et al., "Characterization of Plasma Silicon Nitride Layers", J. Electrochem. Soc.: Solid-State Science and Technology, Dec. 1983, pp. 2419-2423, vol. 130, No. 12.

* cited by examiner

110: 111
130: 131
140: 141
150: 151
160: 161a, 161b

110: 111
130: 131
140: 141
150: 151

DISPLAY DEVICE

CROSS REFERENCE TO RELATED APPLICATION(S)

This is a continuation application based on U.S. patent application Ser. No. 17/149,164, filed on Jan. 14, 2021, now U.S. Pat. No. 11,580,914, the disclosure of which is incorporated herein by reference in its entirety. U.S. patent application Ser. No. 17/149,164 claims priority to and the benefit of Korean Patent Application No. 10-2020-0056279 under 35 U.S.C. § 119 filed in the Korean Intellectual Property Office (KIPO) on May 12, 2020, the entire contents of which are incorporated herein by reference.

BACKGROUND

1. Technical Field

The disclosure relates to a display device, and a method of fabricating the same.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions. Display devices may be flat panel display devices such as a liquid-crystal display device, a field emission display device, and an organic light-emitting display device. Among such flat panel display devices, an organic light-emitting display device includes a light-emitting element so that each of the pixels of the display panel can emit light by themselves. Accordingly, an organic light-emitting display device can display images without a backlight unit that supplies light to the display panel.

An organic light-emitting display device may include pixels. Each of the pixels may include a light-emitting element, a driving transistor for controlling the amount of driving current supplied from a power line to the light-emitting element according to a voltage at the gate electrode, and a scan transistor for supplying a data voltage from a data line to the gate electrode of the driving transistor in response to a scan signal from a scan line.

SUMMARY

Aspects of the disclosure provide a display device that can block or reduce hydrogen (H) flowing into a semiconductor layer from below the semiconductor layer, and a method of fabricating the display device.

It should be noted that objects of the disclosure are not limited to the above-mentioned object; and other objects of the disclosure will be apparent to those skilled in the art from the following descriptions.

An embodiment of a display device may include a buffer layer disposed on a substrate and comprising a first buffer film; and a second buffer film, wherein the first buffer film and the second buffer film are sequentially stacked in a thickness direction of the display device; a semiconductor pattern disposed on the buffer layer; a gate insulating layer disposed on the semiconductor pattern; and a gate electrode disposed on the gate insulating layer; wherein the first buffer film and the second buffer film comprise a same material, and a density of the first buffer film is greater than a density of the second buffer film.

The density of the second buffer film may be equal to or less than about 2.5 g/cm$^3$.

The second buffer film may be disposed under the first buffer film.

A thickness of the second buffer film may be three or more times a thickness of the first buffer film.

A value of [N—H]/[Si—H] of the first buffer film may be greater than a value of [N—H]/[Si—H] of the second buffer film.

The value of [N—H]/[Si—H] of the first buffer film may be five or more times the value of [N—H]/[Si—H] of the second buffer film.

The value of [N—H]/[Si—H] of the second buffer film may is in a range of about 1.3 to about 3.0.

The first buffer film and the second buffer film each may comprise silicon nitride (SiN$_x$).

The buffer layer further may comprise a third buffer film comprising silicon oxide (SiO$_x$), and the third buffer film may be disposed on the first buffer layer and the second buffer layer.

The semiconductor pattern may be disposed on the third buffer film.

The display device may further comprise a fourth buffer film disposed between the first buffer film and the second buffer film. A density of the fourth buffer film may decrease gradually from the first buffer film toward the second buffer film.

A value of [N—H]/[Si—H] of the first buffer film and a value of [N—H]/[Si—H] of the second buffer film may be measured by a Fourier-transform infrared spectrometer (FT-IR spectrometer).

The semiconductor pattern may comprise an oxide semiconductor.

An embodiment of a display device may include a first buffer film disposed on a substrate; a semiconductor pattern disposed on the first buffer film; a gate insulating layer disposed on the semiconductor pattern; and a gate electrode disposed on the gate insulating layer; wherein a value of [N—H]/[Si—H] of the first buffer film is in a range of about 1.3 to about 3.0.

The display device may further comprise a second buffer film disposed on the first buffer film. The first buffer film and the second buffer film may comprise a same material, and a density of the first buffer film may be smaller than a density of the second buffer film.

A value of [N—H]/[Si—H] of the first buffer film may be smaller than a value of [N—H]/[Si—H] of the second buffer film.

A density of the first buffer film may be equal to or less than about 2.5 g/cm$^3$.

An embodiment of a method of fabricating a display device may comprise forming a first buffer film on a substrate; forming a second buffer film on the first buffer film, wherein the second buffer film and the first buffer film include a same material, a density of the second buffer film is smaller than a density of the first buffer film, and dehydrogenating the first buffer film and the second buffer film by a heat treatment.

The method may further comprise after the dehydrogenating of the first buffer film and the second buffer film, forming a semiconductor pattern on the second buffer film.

A value of [N—H]/[Si—H] of the first buffer film after the dehydrogenating may be greater than a value of [N—H]/[Si—H] of the second buffer film after the dehydrogenating, and the value of [N—H]/[Si—H] of the second buffer film may be in a range of about 1.3 to about 3.0.

According to an embodiment of the disclosure, by blocking or reducing hydrogen ($H_2$) flowing into a semiconductor layer from below the semiconductor layer, a transistor including the semiconductor layer can work more efficiently.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions is exaggerated for clarity.

Although the terms "first," "second," or the like may be used herein to describe various elements, these elements should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first," "second," or the like may also be used herein to differentiate different categories or sets of elements. For conciseness, the terms "first," "second," or the like may represent first-category (or first-set), second-category (or second-set), etc., respectively.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described with reference to the accompanying drawings.

Figure 1:
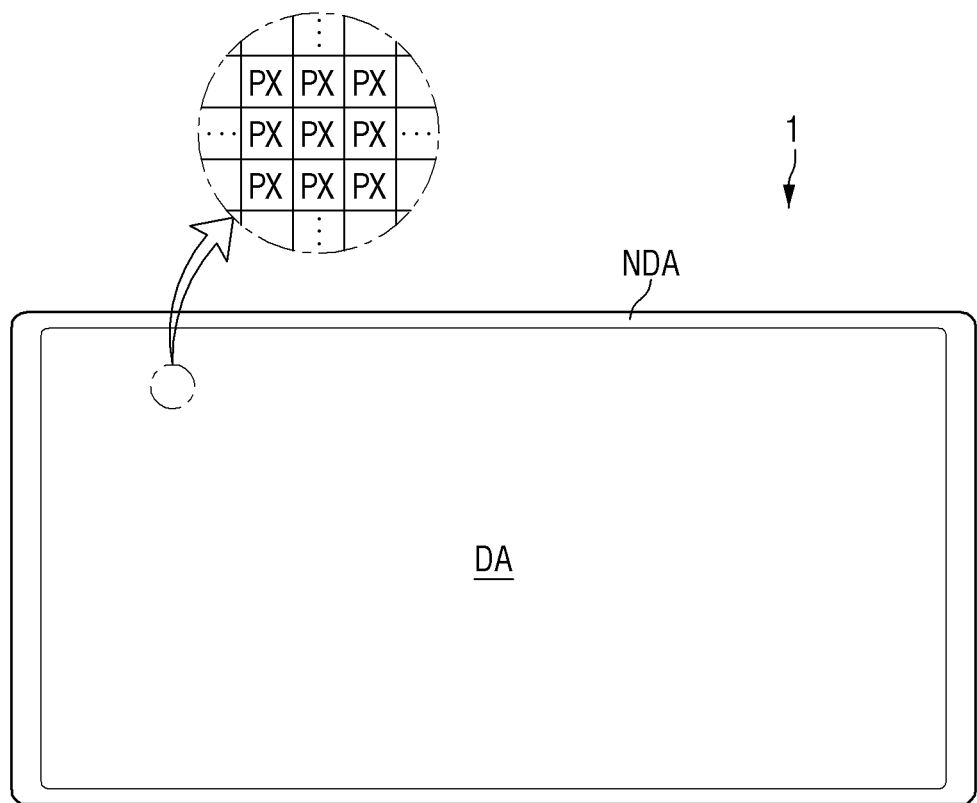
FIG. 1 is a schematic plan view of a display device according to an embodiment of the disclosure.
Figure 1:
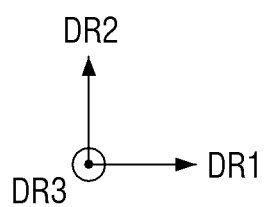
Figure 2:
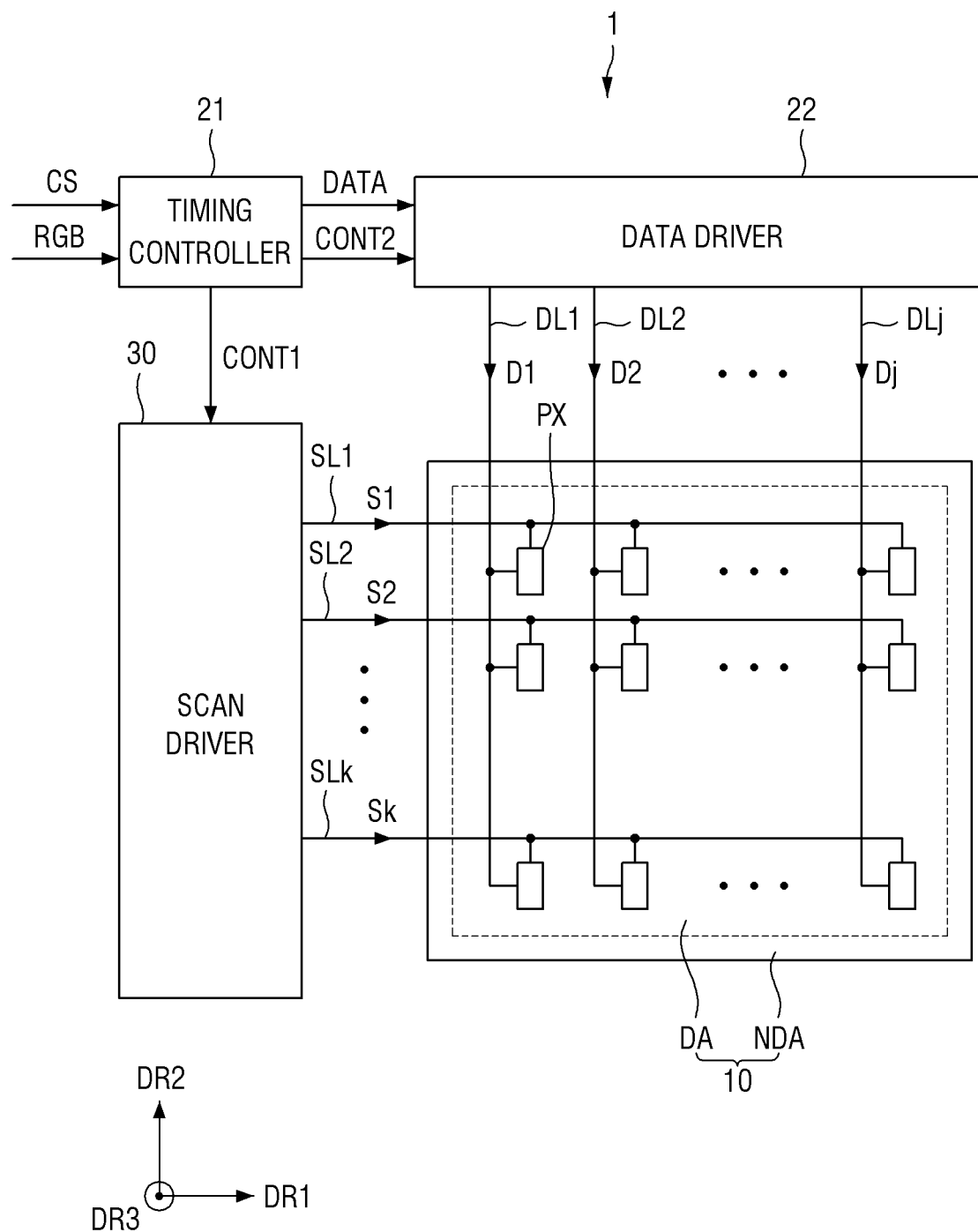
FIG. 2 is a schematic block diagram showing a display device according to an embodiment of the disclosure.

FIG. 1 is a schematic plan view of a display device according to an embodiment of the disclosure. FIG. 2 is a block diagram showing a display device according to an embodiment of the disclosure.

A display device 1 displays moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and an ultra mobile PC (UMPC), as well as the display screen of various products such as a television, a notebook, a monitor, a billboard and the Internet of Things.

According to an embodiment of the disclosure, the display device 1 may have a substantially rectangular shape in a plan view. The display device 1 may have a rectangular shape with corners at the right angle in a plan view. It is, however, to be understood that the disclosure is not limited thereto. The display device 1 may have a rectangular shape with rounded corners in a plan view.

In the drawings, the first direction DR1 denotes the horizontal direction of a display device 1 and the second direction DR2 denotes the vertical direction of the display device 1 in a plan view. The third direction DR3 may refer to the thickness direction of the display device 1. The first direction DR1 is perpendicular to the second direction DR2. The third direction DR3 is orthogonal to the plane, in which the first direction DR1 and the second direction DR2 lie, and is perpendicular to the first and second directions DR1 and DR2. It should be understood that the directions referred with respect to the embodiments are merely relative directions, and the embodiments are not limited to the directions mentioned.

As used herein, the terms "top," "upper surface" and "upper side" in the third direction DR3 refer to the display side of the display device 1, whereas the terms "bottom," "lower surface" and "lower" refer to the opposite side of the display device 1, unless stated otherwise.

The display device 1 according to the embodiment of the disclosure may include a display panel 10, a timing controller 21, a data driver 22, and a scan driver 30.

The display panel 10 may be an organic light-emitting display panel. In the following description, the organic light-emitting display panel is employed as the display panel 10. It is, however, to be understood that other types of display panels such as a liquid-crystal display (LCD) panel, a quantum-dot organic light-emitting display (QD-OLED) panel, a quantum-dot liquid-crystal display (QD-LCD) panel, a quantum-nano light-emitting display (Nano NED) panel, and a micro LED panel may be employed.

The display panel 10 may include a display area DA where images are displayed, and a non-display area NDA where no image is displayed. The display panel 10 may include the display area DA and the non-display area NDA in a plan view. The non-display area NDA may surround or be adjacent to the display area DA. The non-display area NDA may form a bezel.

The display area DA may have a rectangular shape having corners at the right angle or rounded corners in a plan view. It is, however, to be understood that the disclosure is not limited thereto. The shape of the display area DA is not limited to a rectangle, and it may have other shapes such as a circle and an ellipse.

The display area DA may include pixels PX. The pixels PX may be arranged in a matrix. Each of the pixels PX may include an emissive layer and a circuit layer for controlling the amount of light emitted from the emissive layer. The circuit layer may include lines, electrodes, and at least one transistor. The emissive layer may include an organic light-emitting material. The emissive layer may be sealed by an encapsulation layer. The configuration of the pixels PX will be described in detail below.

In the display area DPA, in addition to the pixels PX, scan lines SL1 to SLk, data lines DL1 to DLj, and power lines, which are electrically connected to the pixels PX, may be arranged, where k and j are integers equal to or greater than two. The scan lines SL may be extended in the first direction DR1 and may be arranged in the second direction DR2. The data lines DL may extend in the second direction DR2 and may be arranged in the first direction DR1.

The display panel 10 comprises the pixels PX which are located at the intersections of the scan lines SL1 to SLk and the data lines DL1 to DLj and arranged in a matrix, where k and j are integers equal to or greater than two. Each of the pixels PX may be electrically connected to at least one of the scan lines SL and at least one of the data lines DL.

The timing controller 21 may receive electrical signals, such as control signals CS and video signals RGB. The timing controller 21 generates control signals for controlling the operation timings of the data driver 22 and the scan driver 30. The control signals may include a source control signal CONT2 for controlling the operation timing of the data driver 22, and a scan control signal CONT1 for controlling the operation timing of the scan driver 30.

The scan driver 30 generates scan signals S1 to Sk in response to the scan control signal CONT1 and supplies them to the scan lines SL1 to SLk of the display panel 10, where k is an integer equal to or greater than two.

The data driver 22 converts the digital video data DATA into analog data voltages in response to the source control signal CONT2 and supplies them to the data lines DL1 to DLj of the display panel 10.

A power supply circuit (not shown) may generate voltages required for driving the display panel 10 from a main power applied from the system board and may supply the voltages to the display panel 10.

Figure 3:
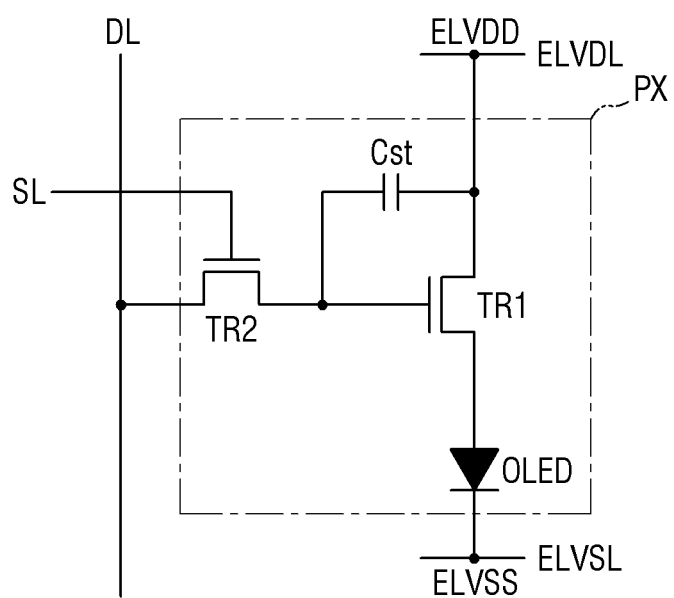
FIG. 3 is a schematic equivalent circuit diagram of a pixel of a display device according to an embodiment of the disclosure.

FIG. 3 is a schematic equivalent circuit diagram of a pixel of a display device according to an embodiment of the disclosure.

Referring to FIG. 3, a pixel PX may include a first transistor TR1, a second transistor TR2, a light-emitting element OLED, and a capacitor Cst. Although FIG. 3 shows that the pixel PX has a 2T1C (2 transistors-1 capacitor) structure having two transistors TR1 and TR2 and one capacitor Cst, but the disclosure is not limited thereto. The pixel PX may include multiple transistors and multiple capacitors. For example, each pixel PX may employ a variety of other modified pixel structures such as a 3T1C structure, a 6T1C structure, and a 7T1C structure.

Each of the first and second transistors TR1 and TR2 may include a first source/drain electrode, a second source/drain electrode, and a gate electrode. One of the first source/drain electrode and the second source/drain electrode may be a source electrode, and the other may be a drain electrode.

Each of the first and second transistors TR1 and TR2 may be formed as a thin-film transistor. Although each of the first and second transistors TR1 and TR2 is implemented as an n-type metal oxide semiconductor field effect transistor (MOSFET) as shown in FIG. 3, the disclosure is not limited thereto. Each of the first transistor TR1 and the second transistor TR2 may be implemented as a p-type MOSFET. For p-type MOSFETs, the positions of the source electrode and the drain electrode of each of the first transistor TR1 and the second transistor TR2 may be changed. In the following description, the first and second transistors TR1 and TR2 are n-type MOSFETs as an example.

The first transistor TR1 may be a driving transistor. For example, the gate electrode of the first transistor TR1 is electrically connected to the second source/drain electrode of the second transistor TR2 and the second electrode (or first electrode) of the capacitor Cst. The first source/drain electrode of the first transistor TR1 is electrically connected to the first power line ELVDL. The second source/drain electrode of the first transistor TR1 is electrically connected to the anode electrode of the light-emitting element OLED. The first transistor TR1 receives a data signal Dj according to the switching operation of the second transistor TR2 and supplies a driving current to the light-emitting element OLED, where j is an integer equal to or greater than one.

The second transistor TR2 may be a switching transistor. For example, the gate electrode of the second transistor TR2 is electrically connected to the scan line SL. The first source/drain electrode of the second transistor TR2 is electrically connected to the data line DL. The second source/drain electrode of the second transistor TR2 is electrically connected to the gate electrode of the first transistor TR1 and the second electrode of the capacitor Cst. The second transistor TR2 performs the switching operation as it is turned on in response to the scan signal Sk to transfer the data signal Dj to the gate electrode of the first transistor TR1, where k and j are integers equal to or greater than one.

The first electrode (or second electrode) of the capacitor Cst may be electrically connected to the first power line ELVDL and the first source/drain electrode of the first transistor TR1, and the second electrode of the capacitor Cst may be electrically connected to the gate electrode of the first transistor TR1 and the second source/drain electrode of the second transistor TR2. The capacitor Cst may serve to store the data voltage applied to the gate electrode of the first transistor TR1.

The light-emitting element OLED may emit light according to the driving current of the first transistor TR1. The light-emitting element OLED may be an organic light-emitting diode including an anode electrode (or a first electrode), an organic emissive layer, and a cathode electrode (or a second electrode). It is, however, to be understood that the disclosure is not limited thereto. The anode electrode of the light-emitting element OLED may be electrically connected to the second source/drain electrode of the first transistor TR1, and the cathode electrode may be electrically connected to a second power line ELVSL to which a second supply voltage ELVSS lower than the first supply voltage ELVDD is applied.

Hereinafter, the cross-sectional structure of the above-described pixel PX will be described in detail.

Figure 4:
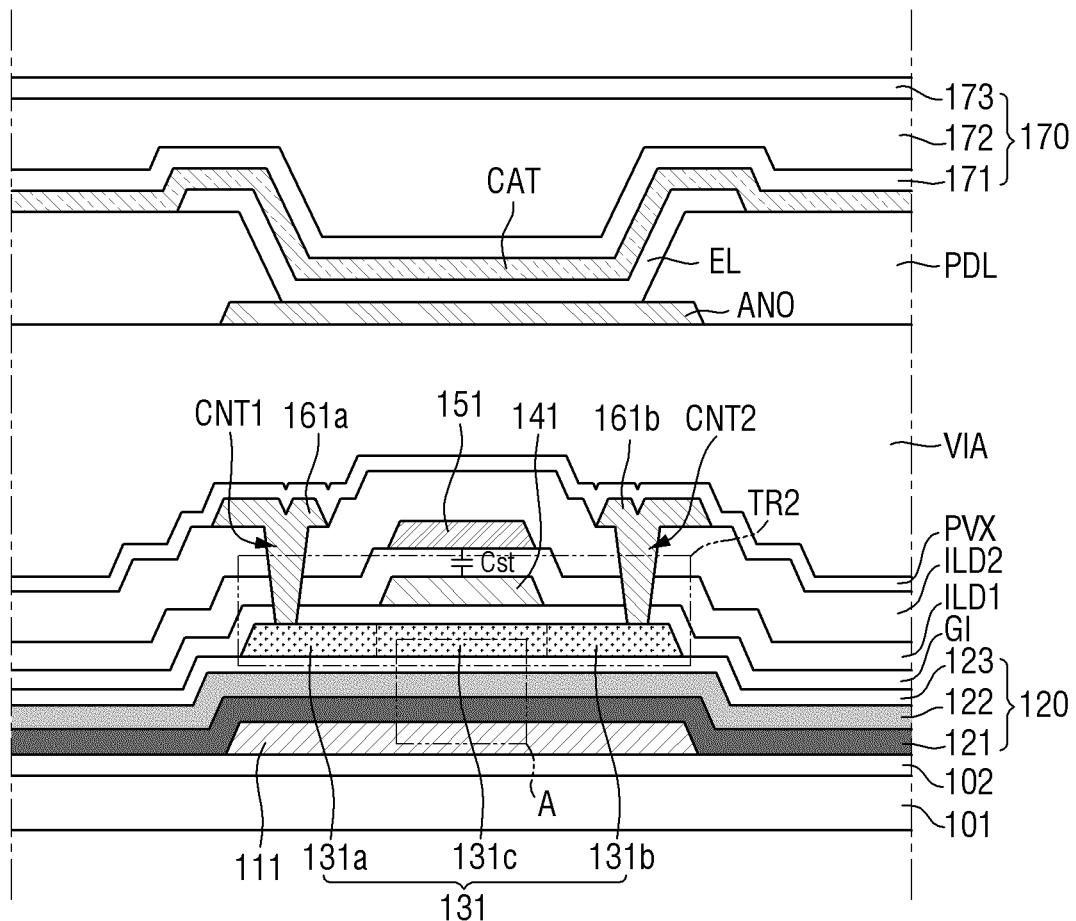
FIG. 4 is a schematic cross-sectional view of a display panel of a display device according to an embodiment of the disclosure.

FIG. 4 is a schematic cross-sectional view of a display panel of a display device according to an embodiment of the disclosure. FIG. 4 shows an example of a second transistor TR2 and a capacitor Cst of a pixel PX.

Referring to FIG. 4, the second transistor TR2 according to an embodiment of the disclosure includes a conductive layer forming an electrode, a semiconductor pattern forming a channel, and an insulating layer. The capacitor Cst includes conductive layers forming electrodes and an insulating layer disposed between the conductive layers. The conductive layers may include a first conductive layer 110, a second conductive layer 140, a third conductive layer 150, a fourth conductive layer 160, an anode electrode ANO, and a cathode electrode CAT. The insulating layers may include a buffer layer 120 (or lower insulating layer), a gate insulating layer GI, a first interlayer dielectric layer ILD1, a second interlayer dielectric layer ILD2, a passivation layer PVX, and a via layer VIA.

The layers of the display panel 10 may be disposed in the order of a base substrate 101, a barrier layer 102, a first conductive layer 110, a buffer layer 120, a semiconductor layer 130, a gate insulating layer GI, a second conductive layer 140, a first interlayer dielectric layer ILD1, a third conductive layer 150, a second interlayer dielectric layer ILD2, a fourth conductive layer 160, a passivation layer PVX, a via layer VIA, an anode electrode ANO, a pixel-defining layer PDL, and so on. Each of the layers described above may be made up of a single layer, or a stack of layers including layers. Other layers may be further disposed between the layers.

The base substrate 101 supports the layers disposed thereon. The base substrate 101 may be made of, e.g., an insulating material such as a polymer resin. Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. The base substrate 101 may include a metallic material.

The base substrate 101 may be a flexible substrate that can be bent, folded, or rolled. An example of the material of the flexible substrate may be, but is not limited to, polyimide (PI).

A transparent substrate may be used in case that the organic light-emitting display device is of a bottom-emission or both-sided emission type. In case that the organic light-emitting display device is of a top-emission type, a semitransparent or opaque substrate as well as a transparent substrate may be employed.

The barrier layer 102 may be disposed on the base substrate 101. The barrier layer 102 may prevent impurity ions from diffusing, may prevent permeation of moisture or outside air, and may provide a flat surface. The barrier layer 102 may include silicon nitride, silicon oxide, silicon oxynitride, or the like. The barrier layer 102 may be removed depending on the type of the base substrate 101, process conditions, etc.

The first conductive layer 110 is disposed on the barrier layer 102. It is, however, to be understood that the disclosure is not limited thereto. In case that the barrier layer 102 is removed, the first conductive layer 110 may be disposed on the base substrate 101. The first conductive layer 110 may include a bottom light-blocking pattern 111.

The bottom light-blocking pattern 111 may be disposed below a semiconductor pattern 131. The bottom light-blocking pattern 111 may overlap at least a channel region 131c of the semiconductor pattern 131 in the thickness direction (third direction DR3). At least a part of the bottom light-blocking pattern 111 may completely overlap the channel region 131c of the semiconductor pattern 131, and may or may not partially overlap the first and second source/drain regions 131a and 131b of the semiconductor pattern 131 of the first transistor TR1 in the thickness direction (third direction DR3). It is, however, to be understood that the disclosure is not limited thereto.

Although not shown in the drawings, the bottom light-blocking pattern 111 may be electrically connected to a gate electrode 151 through a contact hole (not shown) penetrating through the first interlayer dielectric layer ILD1, the gate insulating layer GI, and the buffer layer 120, or may be electrically connected to the first source/drain electrode or the second source/drain through a contact hole (not shown) penetrating through the second interlayer dielectric layer ILD2, the first interlayer dielectric layer ILD1, the gate insulating layer GI, and the buffer layer 120.

The first conductive layer 110 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 110 may be made up of a single layer or multiple layers.

The buffer layer 120 is disposed on the first conductive layer 110. The buffer layer 120 may cover or overlap the first conductive layer 110 in the display area DA and the non-display area NDA and may be disposed entirely on the barrier layer 102 exposed by the first conductive layer 110. The buffer layer 120 may serve as an interlayer dielectric layer that insulates between the first conductive layer 110 and the semiconductor layer 130. The buffer layer 120 may block moisture, outside air, impurities, etc. permeating from the below, thereby protecting the thin-film transistors and the emissive layer disposed thereon.

Figure 5:
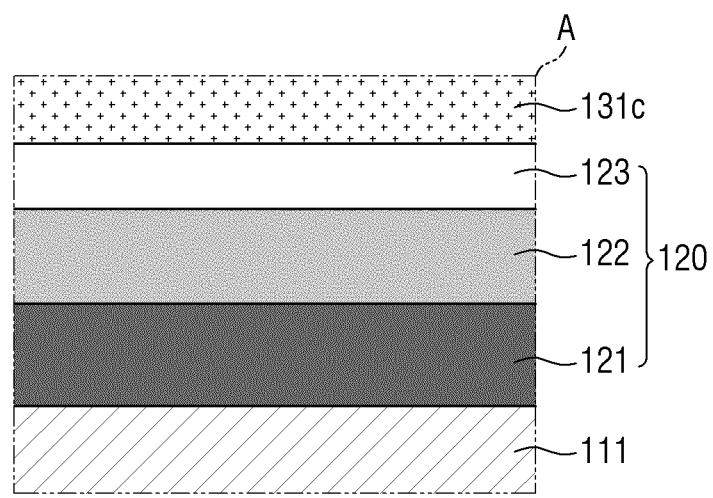
FIG. 5 is a schematic enlarged view of portion A of FIG. 4.

The buffer layer 120 will be described in more detail with reference to FIG. 5. FIG. 5 is a schematic enlarged view of area A shown in FIG. 4. FIG. 5 shows a stack structure of the buffer layer 120.

Referring to FIGS. 4 and 5, the buffer layer 120 may include a first buffer film 121, a second buffer film 122, and a third buffer film 123.

The first buffer film 121 may cover or overlap the first conductive layer 110 and may be disposed on the barrier layer 102. The second buffer film 122 may be disposed on the first buffer film 121, and the third buffer film 123 may be disposed on the second buffer film 122. In other words, the first buffer film 121 may be disposed at the bottom, the third buffer film 123 may be disposed at the top, and the second buffer film 122 may be disposed between the first buffer film 121 and the third buffer film 123.

The first buffer film 121 and the second buffer film 122 may include the same material, and the third buffer film 123 may include a material different from that of the first buffer film 121 and the second buffer film 122. Although not limited thereto, for example, the first buffer film 121 and the second buffer film 122 may include silicon nitride ($SiN_x$), and the third buffer film 123 may include silicon oxide ($SiO_x$).

The thickness of the first buffer film 121 may be equal to the thickness of the second buffer film 122. The sum of the thickness of the first buffer film 121 and the thickness of the second buffer film 122 may be equal to about 80 nm, and the thickness of each of the first buffer film 121 and the second buffer film 122 may be about 40 nm. It is, however, to be understood that the disclosure is not limited thereto.

The buffer layer 120 may include the second buffer film 122, which includes silicon nitride ($SiN_x$) with at least some region of a relatively low density. In other words, the first buffer film 121 and the second buffer film 122 may include the same material but may have different densities. The density of the first buffer film 121 may be greater than that of the second buffer film 122. The density of the first buffer film 121 may be greater than 1.5 or more times, or four or more times the density of the second buffer film 122. Although not limited thereto, the density of the second buffer film 122 may be about 2.3 $g/cm^3$ or less, or about 3.0 $g/cm^3$ or less. The density of each of the first buffer film 121 and the second buffer film 122 may be calculated by measuring the weight per volume.

The first buffer film 121 and the second buffer film 122 may include the same material but may have different composition ratios. In other words, the nitrogen (N) content of the first buffer film 121 may be higher than the nitrogen (N) content of the second buffer film 122, and the silicon (Si) content of the first buffer film 121 may be lower than the silicon (Si) content of the second buffer film 122. For example, the nitrogen (N) content of the first buffer film 121 may be in the range of about 51.0 at % to about 52.5 at %, or about 51.8 at %. The nitrogen (N) content of the second buffer film 122 may be in the range of about 50.0 at % to about 50.9 at % or may be about 50.6 at %. The silicon (Si) content of the first buffer film 121 may be in the range of about 46.0 at % to about 47.5 at %, or about 46.7 at %. The silicon (Si) content of the second buffer film 122 may be in the range of about 47.6 at % to about 49.0 at %, or about 48.4 at %. The composition ratios (or nitrogen (N) content and silicon (Si) content) of the first buffer film 121 and the second buffer film 122 may be analyzed by the X-ray photoelectron spectroscopy (XPS). It is, however, to be understood that the method for analyzing the composition ratio is not limited thereto.

In the first buffer film 121 and the second buffer film 122, the ratio of the bond between nitrogen (N) and hydrogen (H), and the bond between silicon (Si) and hydrogen (H) may be different. The bond between nitrogen (N) and hydrogen (H) may be referred to as a first bond, and the bond between silicon (Si) and hydrogen (H) may be referred to as a second bond. The ratio of the first bond to the second bond in the first buffer film 121 having a relatively high density may be greater than the ratio of the first bond to the second bond in the second buffer film 122 having a relatively low density.

The ratio of the first bond to the second bond in the first buffer film 121 may be greater than the ratio of the first bond to the second bond in the second buffer film 122. For example, in the first buffer film 121 and the second buffer film 122 including silicon nitride ($SiN_x$), as the density of the first buffer film 121 and the second buffer film 122 increases, the number of the first bonds in the first buffer film 121 and the second buffer film 122 increases while the number of the second bonds may decrease. In the second buffer film 122, the ratio of the first bond to the second bond may lie in the range of about 1.3 to about 3.0, or in the range of about 0.7 to about 4.0.

In other words, the value of [N—H]/[Si—H] of the first buffer film 121 may be different from the value of [N—H]/[Si—H] of the second buffer film 122. The value of [N—H]/[Si—H] of the first buffer film 121 may be greater than the value of [N—H]/[Si—H] of the second buffer film 122. Although not limited thereto, the value of [N—H]/[Si—H] of the first buffer film 121 may be five times or greater or ten times or greater the value of [N—H]/[Si—H] of the second buffer film 122. The value of [N—H]/[Si—H] of the first buffer film 121 may be about 16.79 or may lie in the range of about 16 to about 17 or in the range of about 13 to about 20. The value of [N—H]/[Si—H] of the second buffer film 122 may be about 2.81 or may lie in the range of about 1.3 to about 3.0 or in the range of about 0.7 to about 4.0.

[N—H] refers to the number of bonds (first bond) between nitrogen (N) and hydrogen (H) per unit volume of each buffer film in the first buffer film 121 or the second buffer film 122. [Si—H] refers to the number of bonds (second bond) between silicon (Si) and hydrogen (H) per unit volume of each buffer film in the first buffer film 121 or the second buffer film 122. The value of [N—H]/[Si—H] is the ratio of the number of bonds between nitrogen (N) and hydrogen (H) ([N—H]) to the number of bonds between silicon (Si) and hydrogen (H) ([SI—H]) per unit volume of each buffer film in the first buffer film 121 or the second buffer film 122. The values and/or the ratios may be analyzed by, but is not limited to, a Fourier-transform infrared spectrometer (FT-IR spectrometer).

As the density of the buffer films 121 and 122 including silicon nitride ($SiN_x$) increases, more silicon (Si) in the buffer films 121 and 122 may be surrounded by nitrogen (N). The silicon (Si) is combined with nitrogen (N) rather than hydrogen (H), and the nitrogen (N) may be combined with silicon (Si) and hydrogen (H). Therefore, as the density of the buffer films 121 and 122 including silicon nitride ($SiN_x$) increases, the number of bonds (second bonds) between silicon (Si) and hydrogen (H) therein decreases, and the number of nitrogen (N) and hydrogen (H) bonds (first bond) may increase.

As will be described below, the process of forming the buffer layer 120 may include a heat treatment process, and hydrogen ($H_2$) in the buffer layer 120 may be released by the heat treatment process. In such a case, the amount of hydrogen ($H_2$) released from the second buffer layer 122 may be greater than the amount of hydrogen ($H_2$) released from the first buffer layer 121. The hydrogen (H) atoms in the second buffer film 122 having a relatively low density can more freely move than the hydrogen (H) atoms in the first buffer film 121 having a relatively high density, and thus can be more easily combined with other nearby hydrogen (H) atoms. In other words, as the density of the buffer film is lower, the hydrogen (H) inside the buffer film can move more easily to the interface of the buffer film and can bond with other nearby hydrogen (H) atoms. Therefore, hydrogen (H) can be more readily released as a gas from the buffer film having a lower density. Accordingly, the amount of hydrogen ($H_2$) released from the second buffer film 122 having a relatively low density may be greater than that from the first buffer film 121 having a relatively high density.

By disposing the second buffer film 122 having a low density in some regions of the buffer films 121 and 122 including silicon nitride ($SiN_x$), the amount of hydrogen ($H_2$) released from the buffer layer 120 by the heat treatment process may be increased, and the amount of hydrogen ($H_2$) remaining in the buffer layer 120 may decrease after the heat treatment process. Accordingly, the amount of hydrogen ($H_2$) flowing into the semiconductor pattern 131 disposed on the buffer layer 120 may be reduced.

As a result, as the second buffer layer 122 having a low density is disposed, it is possible to suppress or prevent hydrogen ($H_2$) from flowing into the channel region 131c of the semiconductor pattern 131. Accordingly, the threshold voltage Vth of the second transistor TR2 may be generally shifted in a positive direction to obtain a margin for the threshold voltage. It is possible to suppress the threshold voltage Vth of the second transistor TR2 from being shifted generally in the negative direction, and to suppress or prevent a short channel effect of the channel region 131c. For example, it is possible to suppress or prevent defects in the switching characteristics of the second transistor TR2.

More detailed description thereon will be made with reference to FIG. 6.

Figure 6:
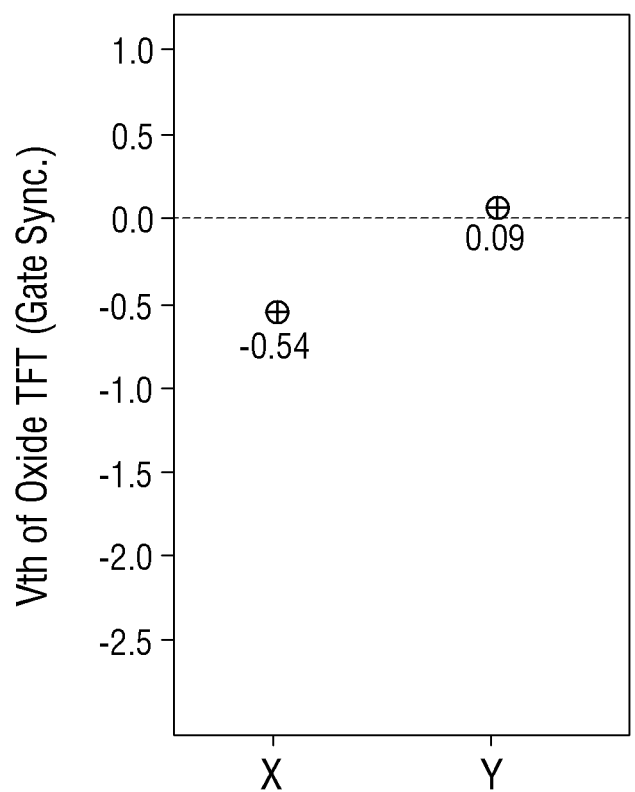
FIG. 6 is a graph showing threshold voltages of transistors with or without a second buffer film according to an embodiment of the disclosure.

FIG. 6 is a graph showing threshold voltages of transistors with or without a second buffer film according to an embodiment of the disclosure. In the graph, X shows an example where the first buffer film 121 is included but the second buffer film 122 is not. Y shows an example where the first buffer film 121 and the second buffer film 122 are included.

Referring to FIG. 6, in the example indicated by X where the first buffer layer 121 having a relatively high density is included but the second buffer layer 122 having a relatively low density is not included, it can be seen that the threshold voltage Vth of the transistor was about −0.54 V, which has been shifted in the negative direction. On the other hand, in the example indicated by Y where the first buffer film 121 having a relatively high density and the second buffer film 122 having a relatively low density are included, it can be seen that the threshold voltage Vth of the transistor was about +0.09 V, which has been shifted in the positive direction.

As a result, in case that the buffer layer 120 includes the first buffer film 121 and the second buffer film 122, the switching characteristics of the transistors may be improved, or it is possible to suppress or prevent the switching characteristics from being lowered.

As the amount of hydrogen ($H_2$) released from the buffer films 121 and 122 including silicon nitride ($SiN_x$) increases, the buffer film 123 including silicon oxide ($SiO_x$) may contain more hydrogen (H). Accordingly, the uniformity (unif) of the buffer layer 123 may be improved, and disposition of the second transistor TR2 may be improved. As the amount of hydrogen ($H_2$) released from the buffer films 121 and 122 including silicon nitride ($SiN_x$) increases, the process temperature for forming the gate insulating layer GI and the interlayer dielectric layers ILD1 and ILD2 may be increased. As a result, the reliability of the transistors including an oxide semiconductor may be improved, and a short channel of the transistor may be implemented.

As the amount of hydrogen ($H_2$) released from the buffer films 121 and 122 including silicon nitride ($SiN_x$) increases, an additional oxide semiconductor layer (not shown) between the gate insulating layer GI and the gate electrode 141 may be unnecessary. The oxide semiconductor layer (not shown) may release hydrogen (H) introduced into the channel region 131c. Accordingly, the number of masks required for the process may be reduced, the process efficiency may be improved, and the process cost may be saved.

Referring back to FIG. 4, the semiconductor layer 130 may be disposed on the buffer layer 120. The semiconductor layer 130 may include the semiconductor pattern 131. The semiconductor pattern 131 may be an active layer of the second transistor TR2.

The semiconductor pattern 131 may overlap the bottom light-blocking pattern 111 in at least some regions. Although not limited thereto, at least some side surfaces of the semiconductor pattern 131 may protrude outward from the side surfaces of the bottom light-blocking pattern 111.

The semiconductor pattern 131 may include a channel region 131c overlapping the gate electrode 141 thereon in the thickness direction, and a first source/drain region 131a and a second source/drain region 131b located on one side and the other side of the channel region 132c, respectively. The first and second source/drain regions 131a and 131b are conductive regions and may have higher conductivity and lower electrical resistance than the channel region 132c.

The semiconductor layer 130 may be made of a material including oxide semiconductor. The oxide semiconductor may include, for example, a binary compound ($AB_x$), a ternary compound ($AB_xC_y$) and a quaternary compound ($AB_xC_yD_z$) containing indium (In), zinc (Zn), gallium (Ga), tin (Sn), titanium (Ti), aluminum (Al), hafnium (Hf), zirconium (Zr), magnesium (Mg), etc. According to an embodiment of the disclosure, the semiconductor layer 130 may include indium tin zinc oxide (IGZO).

The gate insulating layer GI may be disposed on the semiconductor layer 130. The gate insulating layer GI may cover or overlap the semiconductor layer 130 and may be disposed entirely on the buffer layer 120 exposed by the semiconductor layer 130. The gate insulating layer GI may overlap not only the upper surface of the semiconductor layer 130 but also the side surfaces of the semiconductor layer 130. The gate insulating layer GI may serve as a gate insulator that insulates between the semiconductor layer 130 and the second conductive layer 140.

The gate insulating layer GI may include a silicon compound, a metal oxide, etc. For example, the gate insulating layer GI may include silicon oxide, silicon nitride, silicon oxynitride, aluminum oxide, tantalum oxide, hafnium oxide, zirconium oxide, titanium oxide, etc. They may be used alone or in combinations.

The second conductive layer 140 is disposed on the gate insulating layer GI. The second conductive layer 140 may include the gate electrode 141. The gate electrode 141 may be electrically connected to the above-described scan line SL (see FIG. 3). The gate electrode 141 may work as the gate electrode of the second transistor TR2.

The second conductive layer 140 may further include a second electrode 141 of the capacitor Cst. The gate electrode 141 and the second electrode 141 of the capacitor Cst may be integrally formed (or be integral with each other). For example, the second electrode 141 of the capacitor Cst may be formed of the gate electrode 141 itself or may be formed of a portion extended from the gate electrode 141. For example, a part of the pattern of the integrated second conductive layer 140 may overlap the semiconductor pattern 131 to function as the gate electrode 141 at that position, while another part of the pattern may not overlap the semiconductor pattern 131 and function as the second electrode 141 of the capacitor Cst overlapping the first electrode 151 of the capacitor Cst above it.

The second conductive layer 140 may be made of a low resistance material. The second conductive layer 140 may include, but is not limited to, at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The first interlayer dielectric layer ILD1 is disposed on the second conductive layer 140. The first interlayer dielectric layer ILD1 may be generally disposed on the entire surface of the base substrate 101. The first interlayer dielectric layer ILD1 may overlap not only the upper surface of the second conductive layer 140 but also the side surfaces of the second conductive layer 140.

The first interlayer dielectric layer ILD1 may include a silicon compound, a metal oxide, etc. For example, the first interlayer dielectric layer ILD1 may include silicon oxide, silicon nitride, silicon oxynitride, aluminum oxide, tantalum oxide, hafnium oxide, zirconium oxide, titanium oxide, etc. They may be used alone or in combinations.

The third conductive layer 150 is disposed on the first interlayer dielectric layer ILD1. The third conductive layer 150 may include the first electrode 151 of the capacitor Cst. The first electrode 151 of the capacitor Cst may face the second electrode 141 of the capacitor Cst thereunder as it overlaps the second electrode 141 to form the capacitor Cst. The first interlayer dielectric layer ILD1 disposed between the first electrode 151 and the second electrode 141 of the capacitor Cst which overlap each other may function as a dielectric of the capacitor Cst.

The third conductive layer 150 may include, but is not limited to, at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The third conductive layer 150 is disposed on the second interlayer dielectric layer ILD2. The second interlayer dielectric layer ILD2 may be generally disposed on the entire surface of the base substrate 101. The second interlayer dielectric layer ILD2 may overlap not only the upper surface of the third conductive layer 150 but also the side surfaces of the third conductive layer 150.

The second interlayer dielectric layer ILD2 may include a silicon compound, a metal oxide, etc. For example, the first interlayer dielectric layer ILD1 may include silicon oxide, silicon nitride, silicon oxynitride, aluminum oxide, tantalum oxide, hafnium oxide, zirconium oxide, titanium oxide, etc. They may be used alone or in combinations.

The second interlayer dielectric layer ILD2 is disposed on the fourth conductive layer 160. The fourth conductive layer 160 may include a first source/drain electrode 161a and a second source/drain electrode 161b.

The first source/drain electrode 161a may be formed of the data line DL (see FIG. 3) itself or may be electrically connected to the data line DL (see FIG. 3). For example, the first source/drain electrode 161a among some patterns of the fourth conductive layer 160 may be formed integrally with the data line DL (see FIG. 3). A part of the pattern which overlaps the semiconductor pattern 131 may function as the first source/drain electrode 161a of the second transistor TR2, and another part of the pattern which does not overlap the semiconductor pattern 131 may function as the data line DL (see FIG. 3).

A part of the first source/drain electrode 161a which overlaps the semiconductor pattern 131 may be electrically connected to the semiconductor pattern 131 thereunder through a contact hole CNT1 penetrating through the second interlayer dielectric layer ILD2, the first interlayer dielectric layer ILD1, and the gate electrode GI to expose a part of the semiconductor pattern 131.

The second source/drain electrode 161b may be electrically connected to the gate electrode of the first transistor TR1 (see FIG. 3). It is, however, to be understood that the disclosure is not limited thereto. The second source/drain electrode 161b may be formed integrally with the gate electrode of the first transistor TR1 (see FIG. 3).

A part of the second source/drain electrode 161b which overlaps the semiconductor pattern 131 may be electrically connected to the semiconductor pattern 131 thereunder through a contact hole CNT2 penetrating through the second interlayer dielectric layer ILD2, the first interlayer dielectric layer ILD1, and the gate electrode GI to expose a part of the semiconductor pattern 131.

The fourth conductive layer 160 may include at least one metal selected from a group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The fourth conductive layer 160 may be made up of a single layer or multiple layers. For example, the fourth conductive layer 160 may have a stack structure of Ti/Al/Ti, Mo/Al/Mo, Mo/AlGe/Mo, Ti/Cu, etc.

A passivation layer PVX may be disposed on the fourth conductive layer 160. The passivation layer PVX covers or overlaps and protects the second conductive layer 140. The passivation layer PVX may be generally disposed over the entire surface of the base substrate 101. The passivation layer PVX may overlap not only the upper surface of the fourth conductive layer 160 but also the side surfaces of the fourth conductive layer 160.

The passivation layer PVX may include an inorganic insulating material such as silicon oxide, silicon nitride, silicon oxynitride, hafnium oxide, aluminum oxide, titanium oxide, tantalum oxide, and zinc oxide. Although not shown in the drawings, the passivation layer PVX may be formed in the display area DA and may not be formed at least partially in the non-display area NDA.

A via layer VIA may be disposed on the passivation layer PVX. The via layer VIA may be disposed on the passivation layer PVX to completely cover the upper surface of the passivation layer PVX. In case that the via layer VIA is formed as an organic layer, it may have a flat upper surface despite the level differences thereunder.

The via layer VIA may include an inorganic insulating material or an organic insulating material such as polyacrylate resin, epoxy resin, phenolic resin, polyamide resin, polyimide resin, unsaturated polyesters resin, polyphenylen ether resin, polyphenylene sulfide resin, and benzocyclobutene (BCB). The via layer VIA may further include, but is not limited to, a photosensitive material.

An anode electrode ANO is disposed on the via layer VIA. The anode electrode ANO may be disposed separately in each of the pixels. Although not shown in the drawings, the anode electrode ANO may be electrically connected to the second source/drain region (not shown) of the first transistor TR1 (see FIG. 3) through a contact hole (not shown) penetrating through the via layer VIA to expose a part of the second source/drain region (not shown) of the first transistor TR1 (see FIG. 3). The anode electrode ANO may be disposed in the display area DA and may not be disposed in the non-display area NDA.

The anode electrode ANO may have, but is not limited to, a stack structure of a material layer having a high work function such as indium-tin-oxide (ITO), indium-zinc-oxide (IZO), zinc oxide (ZnO), and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca) or a mixture thereof. A layer having a higher work function may be disposed above a reflective material layer so that it is disposed closer to the emissive layer EL. The anode electrode ANO may have, but is not limited to, a multilayer structure of ITO/Mg, ITO/MgF, ITO/Ag, and ITO/Ag/ITO.

A pixel-defining layer PDL may be disposed over the anode electrode ANO. The pixel-defining layer PDL may include an opening exposing a part of the anode electrode ANO. The pixel-defining layer PDL may include an organic insulating material or an inorganic insulating material. For example, the pixel-defining layer PDL may include at least one of a polyimide resin, an acrylic resin, a silicon compound, a polyacrylic resin, and the like.

An emissive layer EL, a cathode electrode CAT, and a thin-film encapsulation layer 170 may be further disposed on the anode electrode ANO exposed by the pixel-defining layer PDL.

The emissive layer EL may include an organic material layer. The organic material layer of the emission layer may include an organic emission layer and may further include a hole injecting/transporting layer and/or an electron injecting/transporting layer.

The cathode electrode CAT may be disposed on the emissive layer EL. The cathode electrode CAT may be a common electrode disposed across the pixels. The anode electrode ANO, the emissive layer EL, and the cathode electrode CAT may form an organic light-emitting element.

The cathode electrode CAT may include a material layer having a small work function such as Li, Ca, LiF/Ca, LiF/Al, Al, Mg, Ag, Pt, Pd, Ni, Au, Nd, Ir, Cr, BaF and Ba, or a compound or mixture thereof (e.g., a mixture of Ag and Mg). The cathode electrode CAT may further include a transparent metal oxide layer disposed on the material layer having a small work function.

The thin-film encapsulation layer 170 is disposed on the cathode electrode CAT. The thin-film encapsulation layer 170 may include a first inorganic film 171, a first organic film 172, and a second inorganic film 173. Although not shown in the drawings, the first inorganic film 171 and the second inorganic film 173 may be in contact with each other at the ends of the thin-film encapsulation layer 170. The first organic film 172 may be sealed by the first inorganic film 171 and the second inorganic film 173.

Each of the first inorganic film 171 and the second inorganic film 173 may include silicon nitride, silicon oxide, silicon oxynitride, or the like. The first organic film 172 may include an organic insulating material.

Hereinafter, a method of fabricating a display device 1 according to an embodiment of the disclosure will be described.

FIGS. 7 to 14 are schematic cross-sectional views illustrating processing steps of a method of fabricating a display device according to an embodiment of the disclosure.

Figure 7:
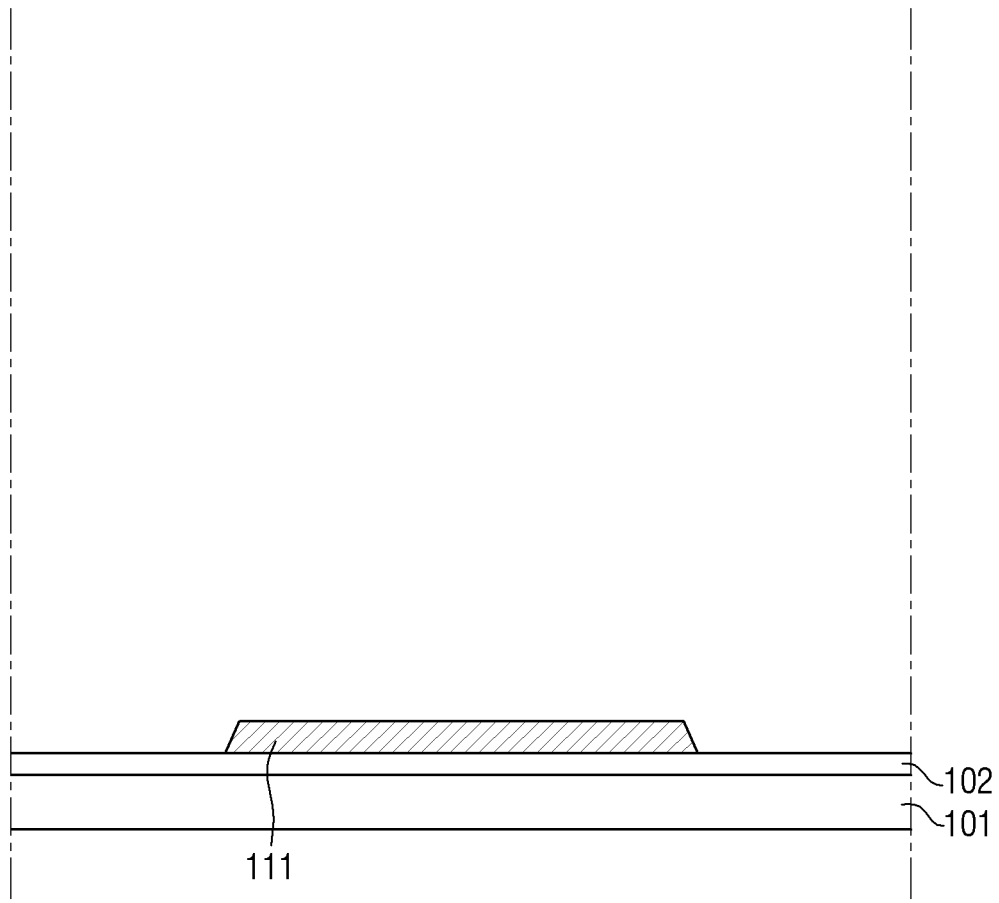
FIGS. 7 to 14 are schematic cross-sectional views illustrating processing steps of a method of fabricating a display device according to an embodiment of the disclosure.

Referring to FIG. 7, a barrier layer 102 is formed on the entirely surface of the base substrate 101, and a patterned first conductive layer 110 is formed on the barrier layer 102.

The patterned first conductive layer 110 may be formed via a mask process. For example, a material layer for the first conductive layer may be deposited entirely on the barrier layer 102 and then may be patterned via a photolithography process to form the first conductive layer 110 including the bottom light-blocking pattern 111 as shown in FIG. 7.

Figure 8:
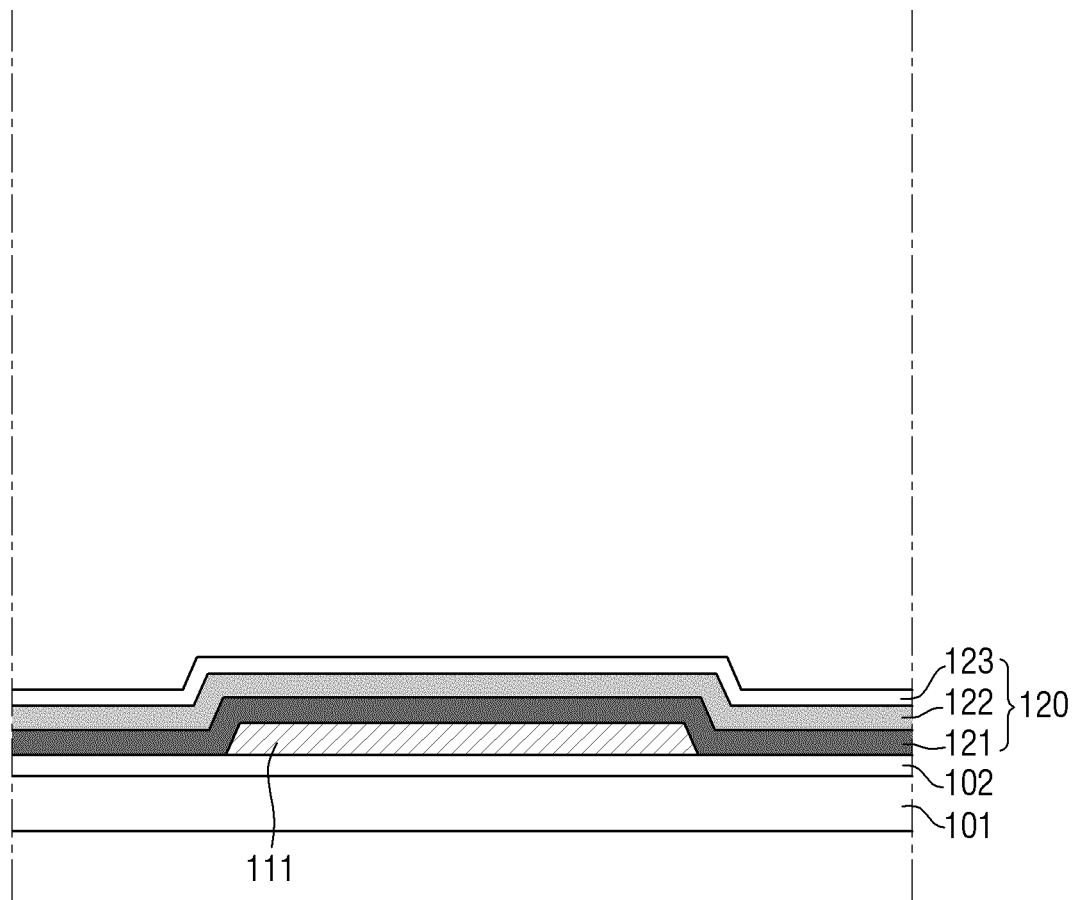
Figure 9:
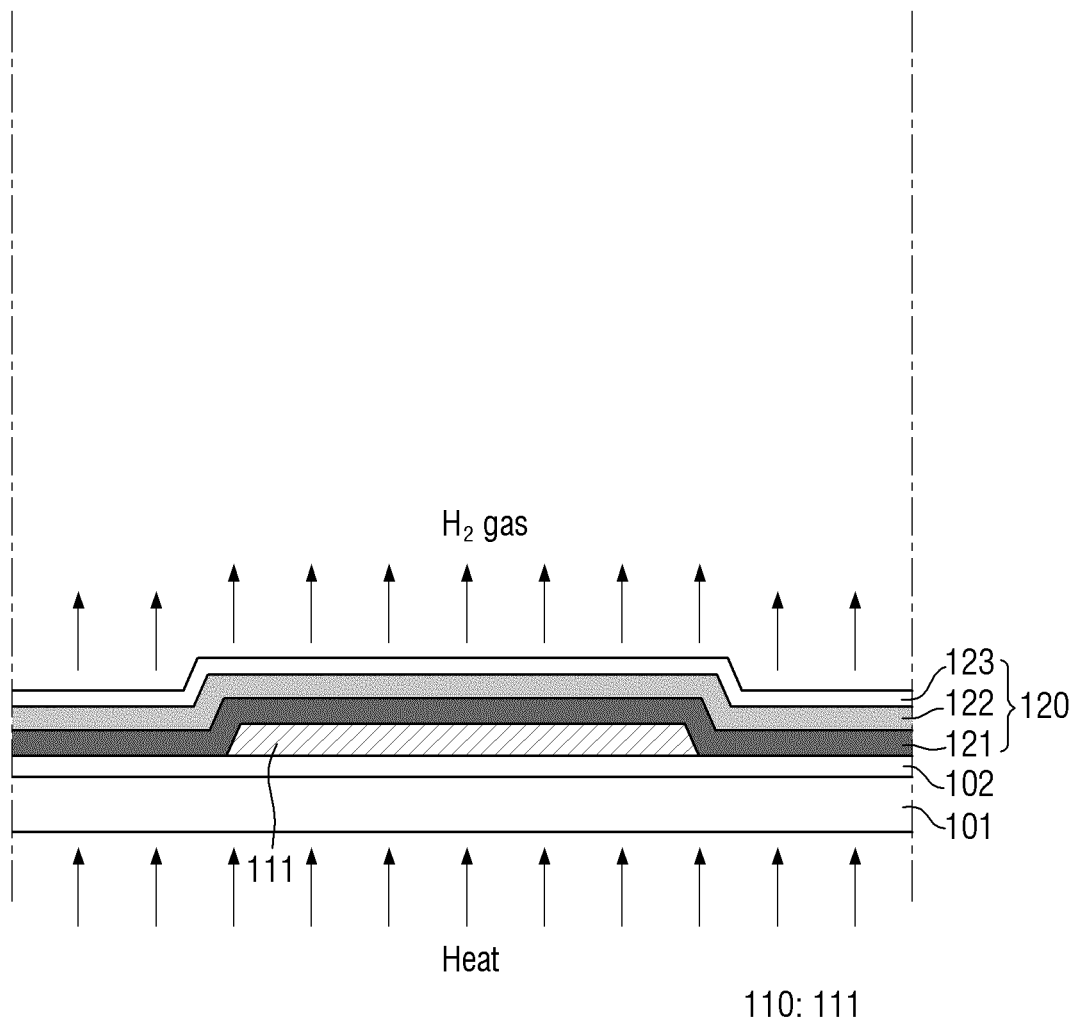

Subsequently, referring to FIGS. 8 and 9, the buffer layer 120 is formed over the barrier layer 102 on which the patterned first conductive layer 110 is disposed, and a dehydrogenation process is carried out.

The buffer layer 120 is formed over the whole surface of the barrier layer 102 on which the first conductive layer 110 is disposed. For example, the first buffer film 121, the second buffer film 122, and the third buffer film 123 are sequentially stacked over the entire barrier layer 102 on which the first conductive layer 110 is disposed.

After the first buffer film 121 is stacked, the ratio between the first bonds of nitrogen (N) and hydrogen (H) and the second bonds of silicon (Si) and hydrogen (H) is adjusted by adjusting the injection amount of ammonium ($NH_3$), nitrogen ($N_2$), and silane ($SiH_4$), so that it is possible to form a second buffer film 122 having a lower density than the first buffer film 121.

After the buffer layer 120 is stacked, dehydrogenation of the buffer layer 120 may be carried out. The dehydrogenation process may include a process such as a heat treatment process for heat treatment at a high temperature. Although not limited thereto, the heat treatment process may include an annealing process. By the dehydrogenation, the content of hydrogen ($H_2$) in the buffer layer 120 may be reduced.

In other words, the bond between hydrogen (H) atoms and silicon (Si) or nitrogen (N) in the second buffer film 122 and the third buffer film 123 may be broken via the heat treatment process and the hydrogen (H) atoms may be bonded with the nearby hydrogen (H) atoms. In this manner, they may be released to the outside of the second buffer film 122 and the third buffer film 123 in the form of hydrogen ($H_2$) gas.

In such a case, a larger amount of hydrogen ($H_2$) gas may be released from the second buffer film 122 having a relatively low density. The amount of hydrogen released from the second buffer film 122 may be about 4,000 or less. The amount of released hydrogen may be measured by thermogravimetric analysis.

It is, however, to be understood that the disclosure is not limited thereto. For example, the hydrogen (H) atoms may move to the second buffer film 122 from the inside of the third buffer layer 123 and interface between the second buffer film 122 and the third buffer film 123 and may meet and combine with other hydrogen (H) atoms in the second buffer film 122 having a relatively low density.

As a result, by disposing the second buffer film 122 having a relatively low density under the third buffer film 123, the dehydrogenation process of the buffer layer 120 can be facilitated, and the amount of hydrogen ($H_2$) in the buffer layer 120 may be additionally reduced via the dehydrogenation process. Accordingly, the amounts of hydrogen (H) atoms and/or hydrogen ($H_2$) permeating into the channel region 131c (see FIG. 4) of the semiconductor pattern 131 thereon (see FIG. 4) may be reduced.

Figure 10:
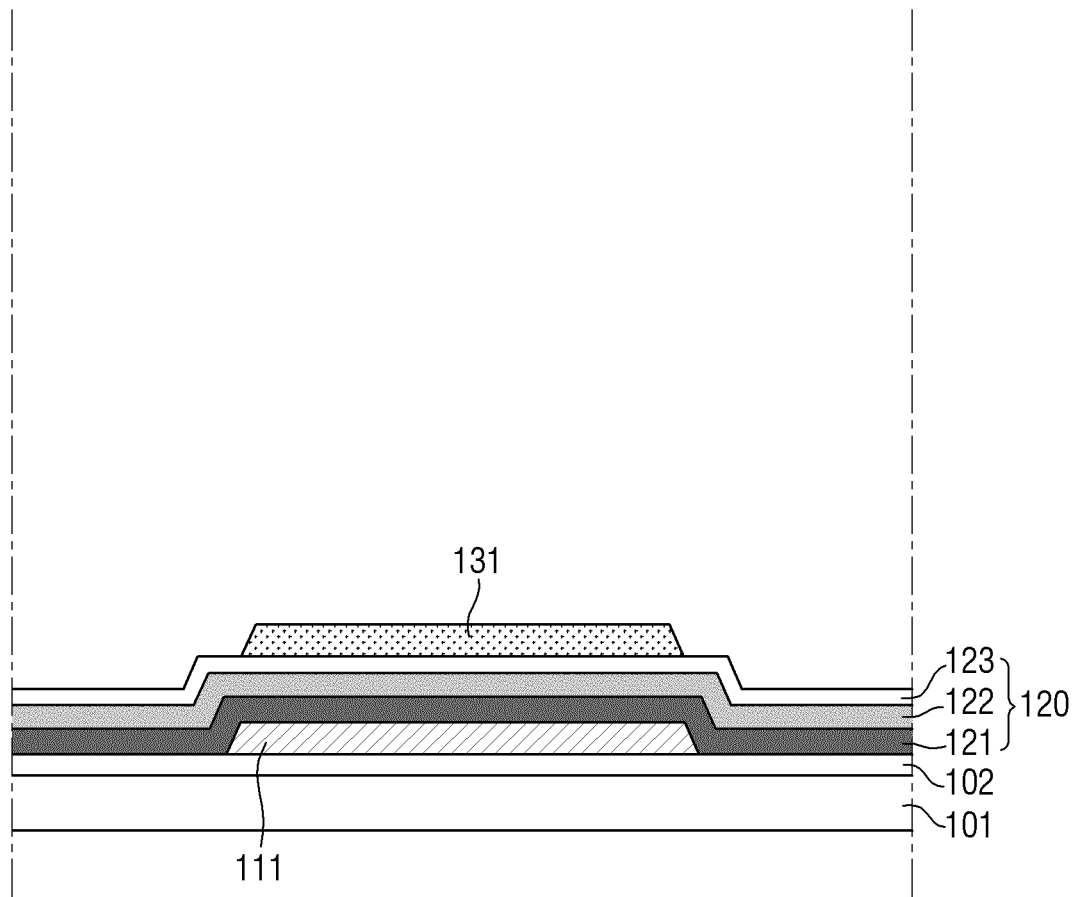

Subsequently, referring to FIG. 10, a patterned semiconductor layer 130 is formed on the buffer layer 120.

The patterned semiconductor layer 130 may be formed via a mask process. For example, a material layer for the semiconductor layer may be deposited entirely on the patterned barrier layer 120 and then may be patterned via a photolithography process to form the semiconductor layer 130 including the first semiconductor pattern 131 as shown in FIG. 10.

Figure 11:
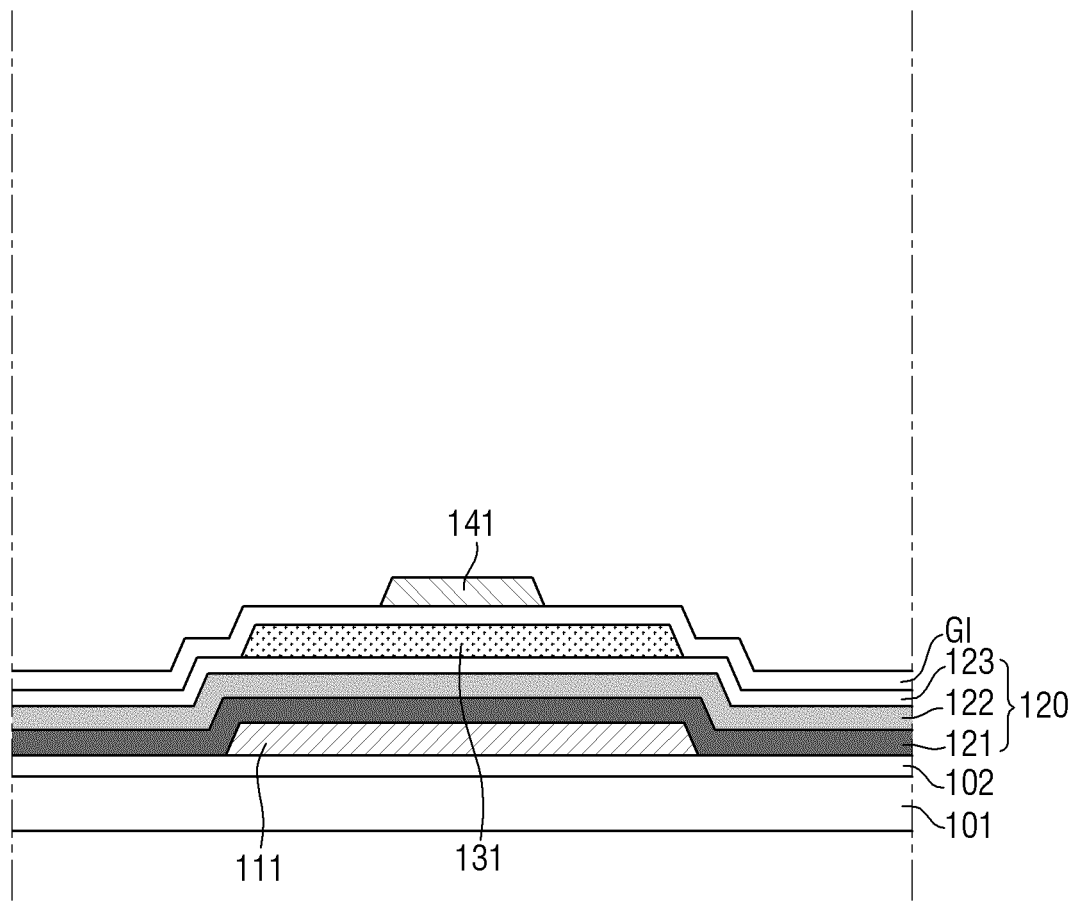

Subsequently, referring to FIG. 11, a gate insulating layer GI is deposited entirely over the buffer layer 120, on which the semiconductor layer 130 is disposed, and a second conductive layer 140 is formed on the gate insulating layer GI.

The gate insulating layer GI is deposited entirely over the buffer layer 120 on which the semiconductor layer 130 is disposed, and the patterned second conductive layer 140 is formed on the gate insulating layer GI. The patterned second conductive layer 140 may be formed via a mask process. For example, a material for the second conductive layer may be deposited entirely on the gate insulating layer GI and may be patterned via a photolithography process to form the second conductive layer 140 including the gate electrode 141 as shown in FIG. 11.

Figure 12:
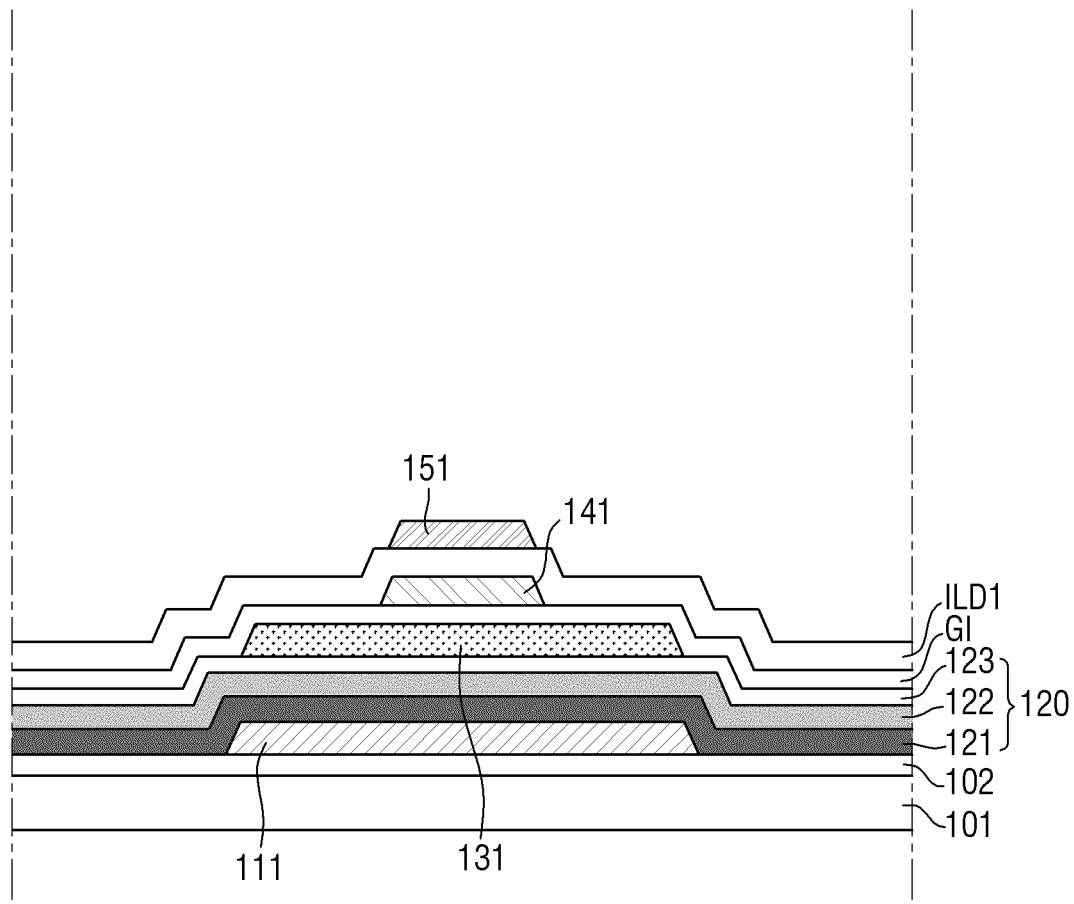

Subsequently, referring to FIG. 12, a first interlayer dielectric layer ILD1 is deposited entirely over the gate insulating layer GI on which the second conductive layer 140 is disposed, and a third conductive layer 150 is formed on the first interlayer dielectric layer ILD1.

The first interlayer dielectric layer ILD1 is deposited entirely over the gate insulating layer GI on which the second conductive layer 140 is disposed, and the patterned third conductive layer 150 is formed on the first interlayer dielectric layer ILD1. The patterned third conductive layer 150 may be formed via a mask process. For example, a material for the third conductive layer may be deposited entirely on the first interlayer dielectric layer and may be patterned via a photolithography process to form the third conductive layer 150 including the first electrode 151 of the capacitor Cst as shown in FIG. 12.

Subsequently, referring to FIG. 13, the second interlayer dielectric layer ILD2 is deposited entirely over the first interlayer dielectric layer ILD1 on which the third conductive layer 150 is disposed, and a fourth conductive layer 160 is formed on the second interlayer dielectric layer ILD2.

Firstly, the second interlayer dielectric layer ILD2 is deposited entirely over the first interlayer dielectric layer ILD1 on which the third conductive layer 150 is disposed, and then contact holes CNT1 and CNT2 exposing the first semiconductor pattern 131 are formed. The contact holes CNT1 and CNT2 may be formed via a mask process. A photoresist pattern exposing a part of the first semiconductor pattern 131 is formed on the second interlayer dielectric layer ILD2; and the second interlayer dielectric layer ILD2, the first interlayer dielectric layer ILD1, and the gate insulating layer GI are etched by using it as an etch mask, so that the contact holes CNT1 and CNT2 exposing a part of the first semiconductor pattern 131.

Subsequently, the patterned fourth conductive layer 160 is formed on the second interlayer dielectric layer ILD2. The patterned fourth conductive layer 160 may be formed via a mask process. For example, a material layer for the fourth conductive layer is deposited entirely on the second interlayer dielectric layer ILD2. During the deposition process, the material layer for the fourth conductive layer may be deposited even in the contact holes CNT1 and CNT2. Each of the first source/drain electrode 161a and the second source/drain electrode 161b may be physically and/or electrically connected to the first semiconductor pattern 131.

Figure 13:
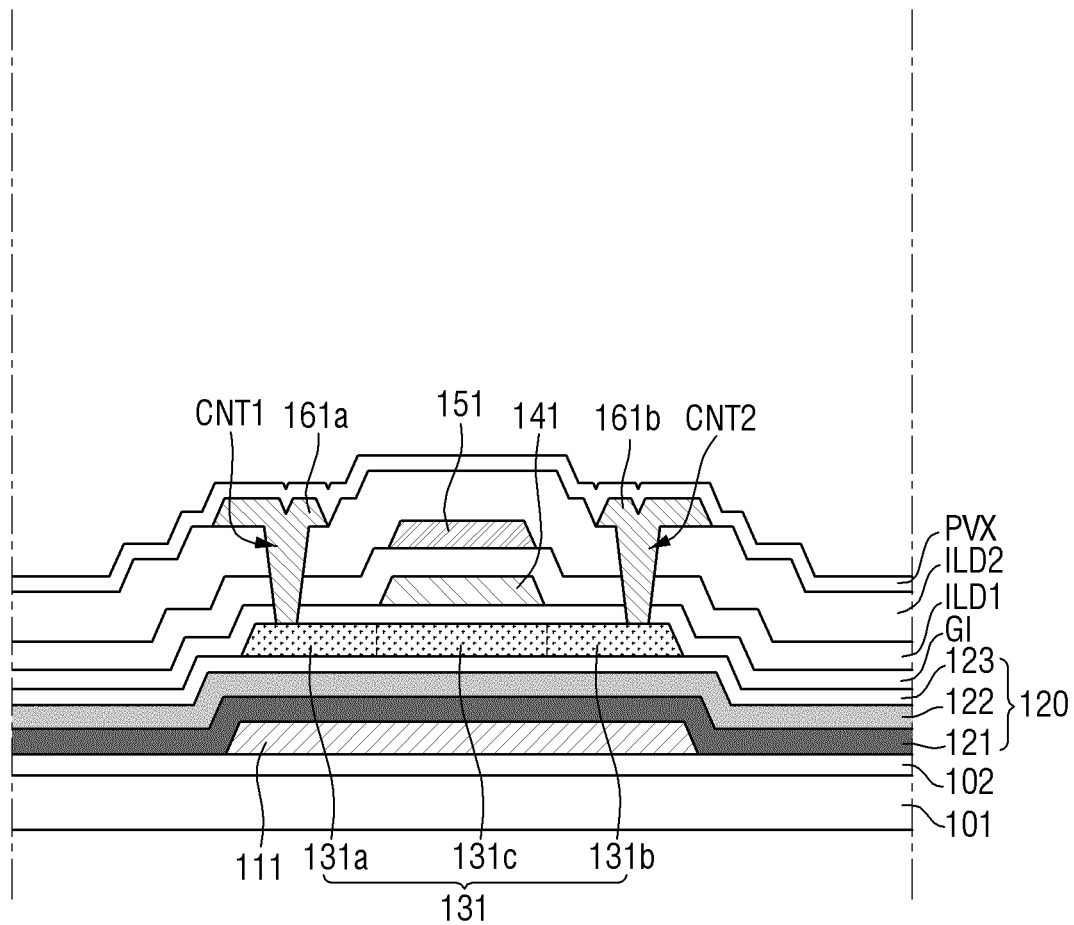

Subsequently, after applying a photoresist layer on the material layer for the fourth conductive layer, and forming a photoresist pattern by exposure and development, a material layer for the fourth conductive layer is patterned using it as an etching mask, so that the fourth conductive layer 160 including the first source/drain electrode 161a and the second source/drain electrode 161b as shown in FIG. 13 is completed.

Figure 14:
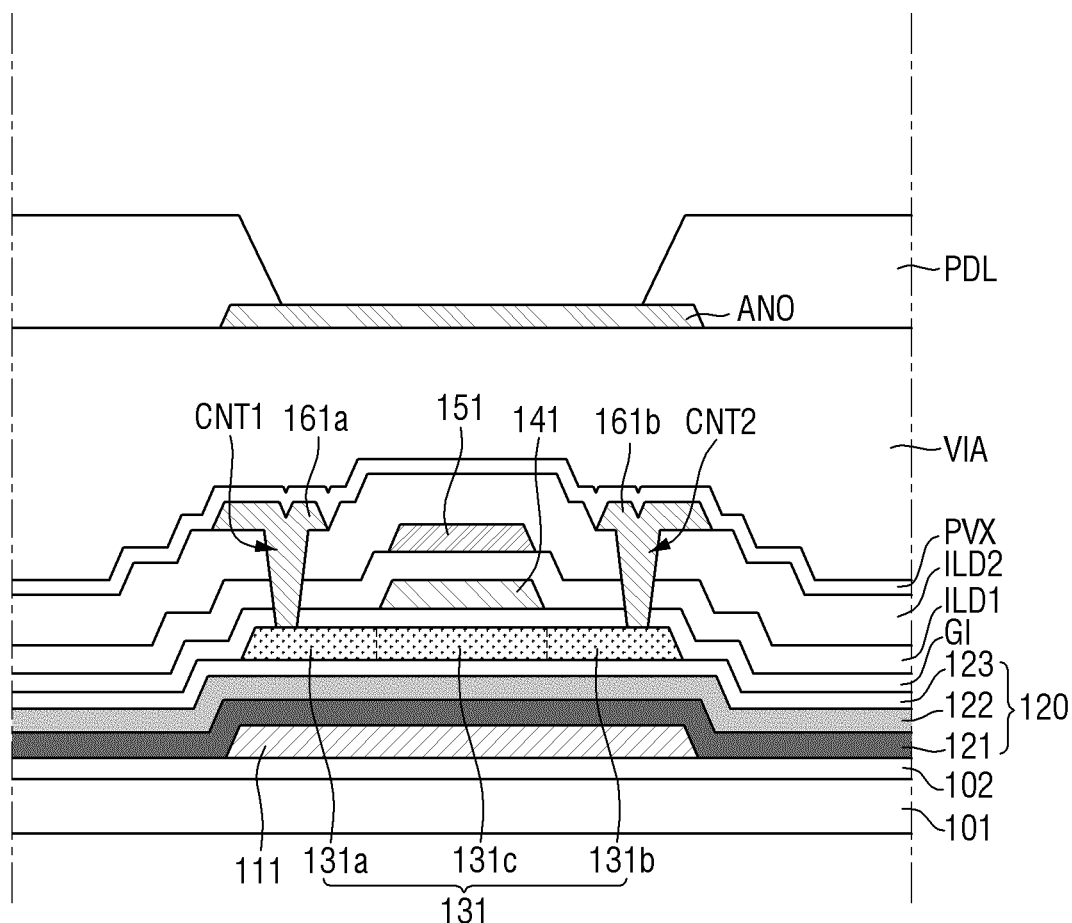

Subsequently, referring to FIG. 14, a via layer VIA is formed on the fourth conductive layer 160, and an anode electrode ANO is formed on the via layer VIA. Subsequently, a patterned pixel-defining layer PDL is formed on the via layer VIA.

The via layer VIA is formed by applying a material layer for the via layer over the second interlayer dielectric layer ILD2 on which the fourth conductive layer 160 is disposed, overlapping the fourth conductive layer 160. Subsequently, although not shown in the drawings, a via contact hole (not shown) penetrating through the via layer VIA may be formed by etching the via layer VIA. The via contact hole (not shown) may expose the second source/drain electrode (not shown) of the first transistor TR1 (see FIG. 3).

After the via layer VIA is formed, an anode electrode ANO is formed. The anode electrode ANO may be formed via a mask process. For example, a material layer for the anode electrode is deposited entirely on the via layer VIA. During the deposition process, the material layer for the anode electrode may be deposited even in the via contact hole (not shown). Accordingly, the anode electrode ANO may be electrically connected to the second source/drain electrode (not shown) of the first transistor TR1 (see FIG. 3).

After applying a photoresist layer on the material layer for the anode electrode, a photoresist pattern is formed by exposure and development, and then the material layer for the anode electrode is etched using it as an etching mask. Subsequently, the photoresist pattern is removed via a strip or ashing process, to complete the patterned anode electrode ANO as shown in FIG. 14.

After the anode electrode ANO is formed, a patterned pixel-defining layer PDL is formed on the via layer VIA, overlapping the anode electrode ANO.

The pixel-defining layer PDL may be made of, for example, an organic material including a photosensitive material. In such a case, the patterned pixel-defining layer PDL may be formed through exposure and development after the organic material layer for the pixel-defining layer is applied. Accordingly, a patterned pixel-defining layer PDL may be formed as shown in FIG. 14.

The pixel-defining layer PDL may be formed along the periphery of the pixel PX and may partially overlap the anode electrode ANO. The pixel-defining layer PDL may be formed to overlap a via contact hole (not shown). If the anode electrode ANO does not completely fill the internal space of the via contact hole (not shown) but only a part of it, the pixel-defining layer PDL may completely fill the internal space of the via contact hole (not shown).

Since a method for producing the emissive layer EL (see FIG. 4), the cathode electrode CAT (see FIG. 4), and the thin-film encapsulation layer 170 (see FIG. 4) above the pixel-defining layer PDL is well known, and thus will not be described herein.

Hereinafter, other embodiments of the disclosure will be described. In the following description, the same or similar elements will be denoted by the same or similar reference numerals, and redundant descriptions will be omitted or briefly described. Descriptions will focus on differences from the above-described embodiments.

Figure 15:
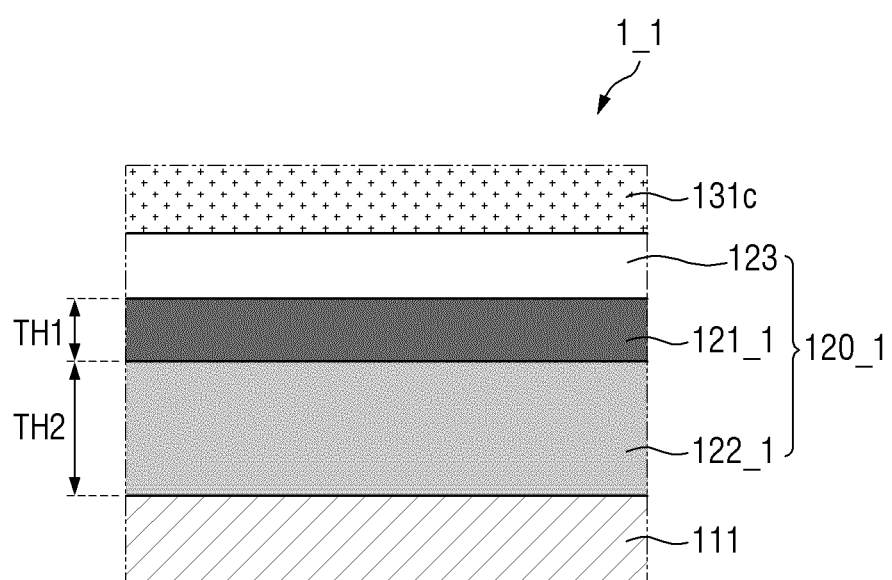
FIG. 15 is a schematic enlarged view showing a part of a cross section of a display device according to another embodiment of the disclosure.

FIG. 15 is a schematic enlarged view showing a part of a cross section of a display device according to another embodiment of the disclosure.

The embodiment of FIG. 15 is substantially identical to the embodiment of FIG. 4 except that the stacking order of a first buffer film 121_1 and a second buffer film 122_1 of a display device 1_1 is altered.

For example, a buffer layer 120_1 according to the embodiment of the disclosure includes a first buffer film 121_1, a second buffer film 122_1 and a third buffer film 123, with the first buffer film 121_1 disposed between the second buffer film 122_1 and the third buffer film 123. In other words, the second buffer film 122_1 may be disposed under the first buffer film 121_1, and the third buffer film 123 may be disposed on the first buffer film 121_1.

The thickness TH2 of the second buffer film 122_1 may be greater than the thickness TH1 of the first buffer film 121_1. Although not limited thereto, the thickness TH2 of the second buffer film 122_1 may be three or more times the thickness TH1 of the first buffer film 121_1.

In this case, as the second buffer film 122_1 having a low density is disposed, it is possible to suppress or prevent hydrogen ($H_2$) from flowing into the channel region 131c of the semiconductor pattern 131. Therefore, it is possible to suppress or prevent a short channel effect of the channel region 131c, thereby suppressing or preventing defects in switching characteristic of the second transistor TR2.

More detailed description thereon will be made with reference to FIG. 16.

Figure 16:
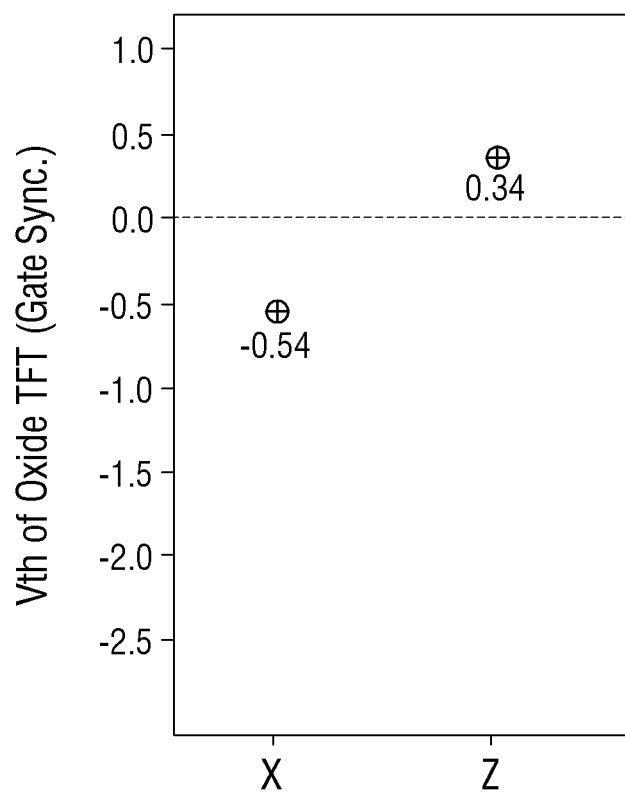
FIG. 16 is a graph showing threshold voltages of transistors with or without a second buffer film according to another embodiment.

FIG. 16 is a graph showing threshold voltages of transistors with or without a second buffer film according to another embodiment. In the graph, X shows an example where a first buffer film 121_1 is included but a second buffer film 122_1 is not. Z shows an example according to another embodiment where the first buffer film 121_1 and the second buffer film 122_1 are included.

Referring to FIG. 16, it can be seen that the threshold voltage Vth of the transistor was about +0.34V, which has been shifted in the positive direction even in the example indicated by Z where the first buffer layer 121_1 having a relatively high density and the second buffer film 122_1 having a relatively low density are included and the first buffer film 121_1 is disposed on the second buffer film 122_1.

Figure 17:
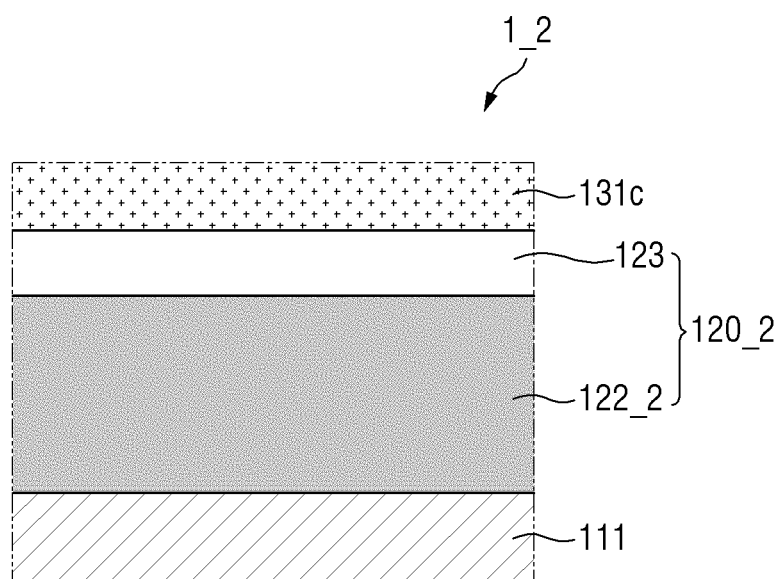
FIG. 17 is a schematic enlarged view showing a part of a cross section of a display device according to yet another embodiment of the disclosure.

FIG. 17 is a schematic enlarged view showing a part of a cross section of a display device according to yet another embodiment of the disclosure.

The embodiment of FIG. 17 is substantially identical to the embodiment of FIG. 4 except that a display device 1_2 does not include the first buffer film 121 (see FIG. 4).

A buffer layer 120_2 according to this embodiment may include the second buffer film 122_2 and the third buffer film 123, but not the first buffer film 121 (see FIG. 4). The thickness of the second buffer film 122_2 may be, but is not limited to, about 80 nm or within a range of about 70 nm to about 90 nm.

In this case, as the second buffer film 122_2 having a small density is disposed, it is possible to suppress or prevent hydrogen ($H_2$) from flowing into the channel region 131c of the semiconductor pattern 131. Therefore, it is possible to suppress or prevent a short channel effect of the channel region 131c, thereby suppressing or preventing defects in switching characteristic of the second transistor TR2.

More detailed description thereon will be made with reference to FIG. 18.

Figure 18:
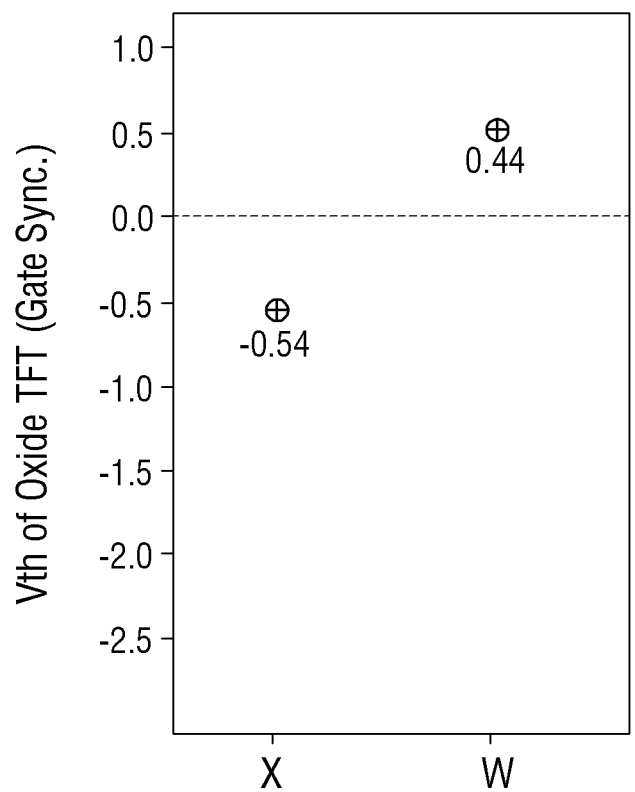
FIG. 18 is a graph showing threshold voltages of transistors with or without a second buffer film according to yet another embodiment.

FIG. 18 is a graph showing threshold voltages of transistors with or without a second buffer film according to yet another embodiment. In the graph, X shows an example where a first buffer film 121_1 is included but a second buffer film 122_1 is not. Z shows an example according to yet another embodiment where the second buffer film 122_2 is included.

Referring to FIG. 18, it can be seen that the threshold voltage Vth of the transistor was about +0.44V, which has been shifted in the positive direction even in the example indicated by W where the first buffer film 121_1 having a relatively high density is not included and only the second buffer film 122_1 having a relatively low density is included.

Figure 19:
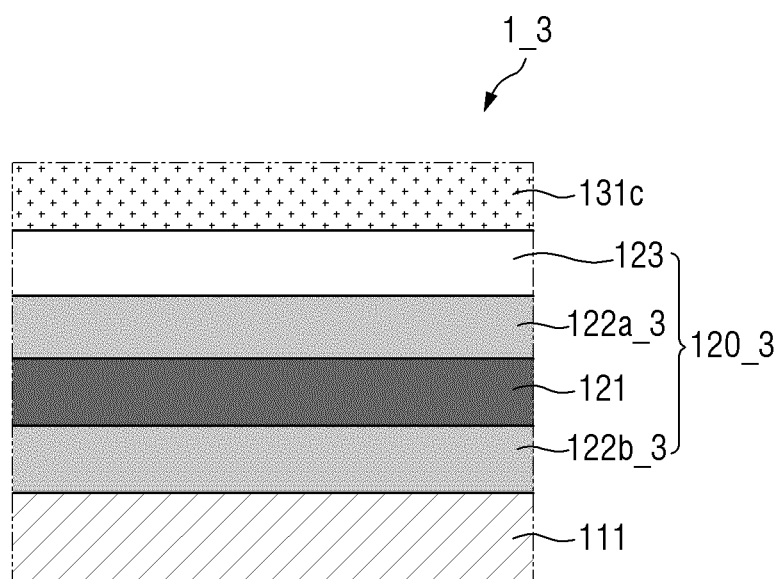
FIG. 19 is a schematic enlarged view showing a part of a cross section of a display device according to yet another embodiment of the disclosure.

FIG. 19 is a schematic enlarged view showing a part of a cross section of a display device according to yet another embodiment of the disclosure.

The embodiment of FIG. 19 is substantially identical to the embodiment of FIG. 4 except that a display device 1_3 includes second buffer films 122a_3 and 122b_3.

A buffer layer 120_3 according to this embodiment may include second buffer films 122a_3 and 122b_3, a first buffer film 121 and a third buffer film 123. The first buffer film 121 may be disposed, for example, between second buffer films 122a_3 and 122b_3. The second buffer films 122a_3 and 122b_3 may be substantially identical to each other and may be substantially identical to the second buffer film 122 described above with reference to FIG. 4.

In this case, as the second buffer layers 122a_3 and 122b_3 having a small density are disposed, it is possible to suppress or prevent hydrogen ($H_2$) from flowing into the channel region 131c of the semiconductor pattern 131. Therefore, it is possible to suppress or prevent a short channel effect of the channel region 131c, thereby suppressing or preventing defects in switching characteristic of the second transistor TR2.

Although two second buffer films 122a_3 and 122b_3 are illustrated in this embodiment, the number is not limited thereto. Although the buffer layer 120_3 is shown as including second buffer films 122a_3 and 122b_3, the disclosure is not limited thereto. The buffer layer 120_3 may include second buffer films 122a_3 and 122b_3 and/or first buffer films 121.

Figure 20:
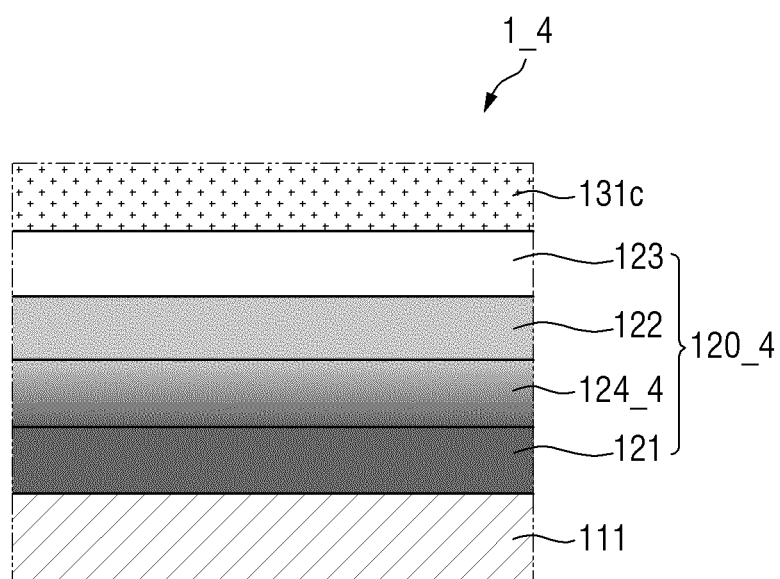
FIG. 20 is a schematic enlarged view showing a part of a cross section of a display device according to yet another embodiment of the disclosure.

FIG. 20 is a schematic enlarged view showing a part of a cross section of a display device according to yet another embodiment of the disclosure.

The embodiment of FIG. 20 is substantially identical to the embodiment of FIG. 4 except that a display device 1_4 further includes a fourth buffer film 124_4 with gradually varying density.

A buffer layer 120_4 according to this embodiment may include a fourth buffer layer 124_4 in addition to the first buffer film 121, the second buffer film 122 and the third buffer layer 123. The fourth buffer film 124_4 may include regions having different densities. Although not limited thereto, for example, the density of the fourth buffer film 124_4 may gradually decrease from the bottom to the top. In other words, the density of the fourth buffer film 124_4 may increase from the second buffer film 122 toward the first buffer film 121. The density of the fourth buffer layer 124_4 may be substantially equal to the density of the second buffer film 122 at the interface therebetween and may be substantially equal to the density of the first buffer film 121 at the interface therebetween.

In this case, as the second buffer film 122 having a small density is disposed, it is possible to suppress or prevent hydrogen (H$_2$) from flowing into the channel region 131c of the semiconductor pattern 131. Therefore, it is possible to suppress or prevent a short channel effect of the channel region 131c, thereby suppressing or preventing defects in switching characteristic of the second transistor TR2.

Although the density of the fourth buffer film 124_4 gradually decreases toward the upper side according to the embodiment, the disclosure is not limited thereto. The density of the fourth buffer film 124_4 may gradually increase toward the upper side.

Figure 21:
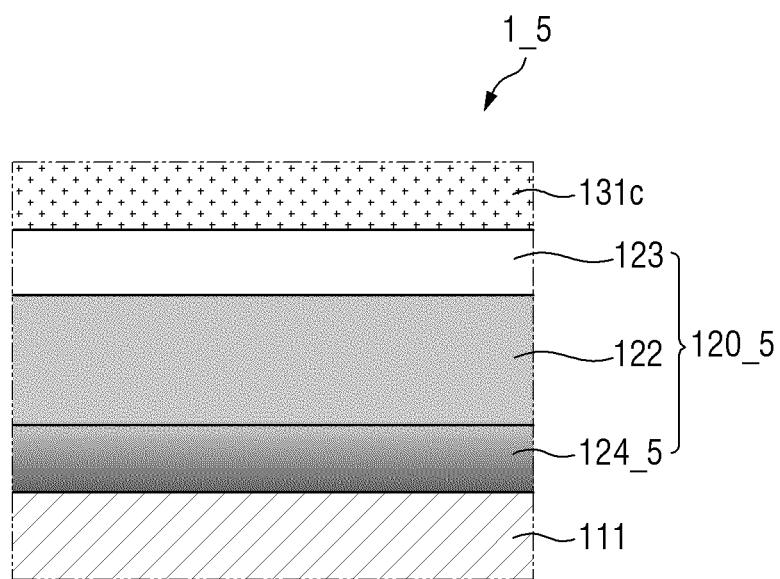
FIG. 21 is a schematic enlarged view showing a part of a cross section of a display device according to yet another embodiment of the disclosure.

FIG. 21 is a schematic enlarged view showing a part of a cross section of a display device according to yet another embodiment of the disclosure.

The embodiment of FIG. 21 is substantially identical to the embodiment of FIG. 20 except that a display device 1_5 does not include the first buffer film 121 (see FIG. 20).

A buffer layer 120_5 according to this embodiment may include a second buffer film 122, a third buffer film 123, and a fourth buffer film 124_5, but not a first buffer film 121. In such a case, the fourth buffer layer 124_5 may be disposed on the bottom light-blocking pattern 111, and the second buffer film 122 and the third buffer film 123 may be disposed on the fourth buffer layer 124_5.

In this case, as the second buffer film 122 having a small density is disposed, it is possible to suppress or prevent hydrogen (H$_2$) from flowing into the channel region 131c of the semiconductor pattern 131. Therefore, it is possible to suppress or prevent a short channel effect of the channel region 131c, thereby suppressing or preventing defects in switching characteristic of the second transistor TR2.

Although the buffer layer 120_5 according to this embodiment is described as not including the first buffer film 121 (see FIG. 20), but the disclosure is not limited thereto. The buffer layer 120_5 may not include at least one of the first buffer film 121 (see FIG. 20) and the second buffer film 122.

Figure 22:
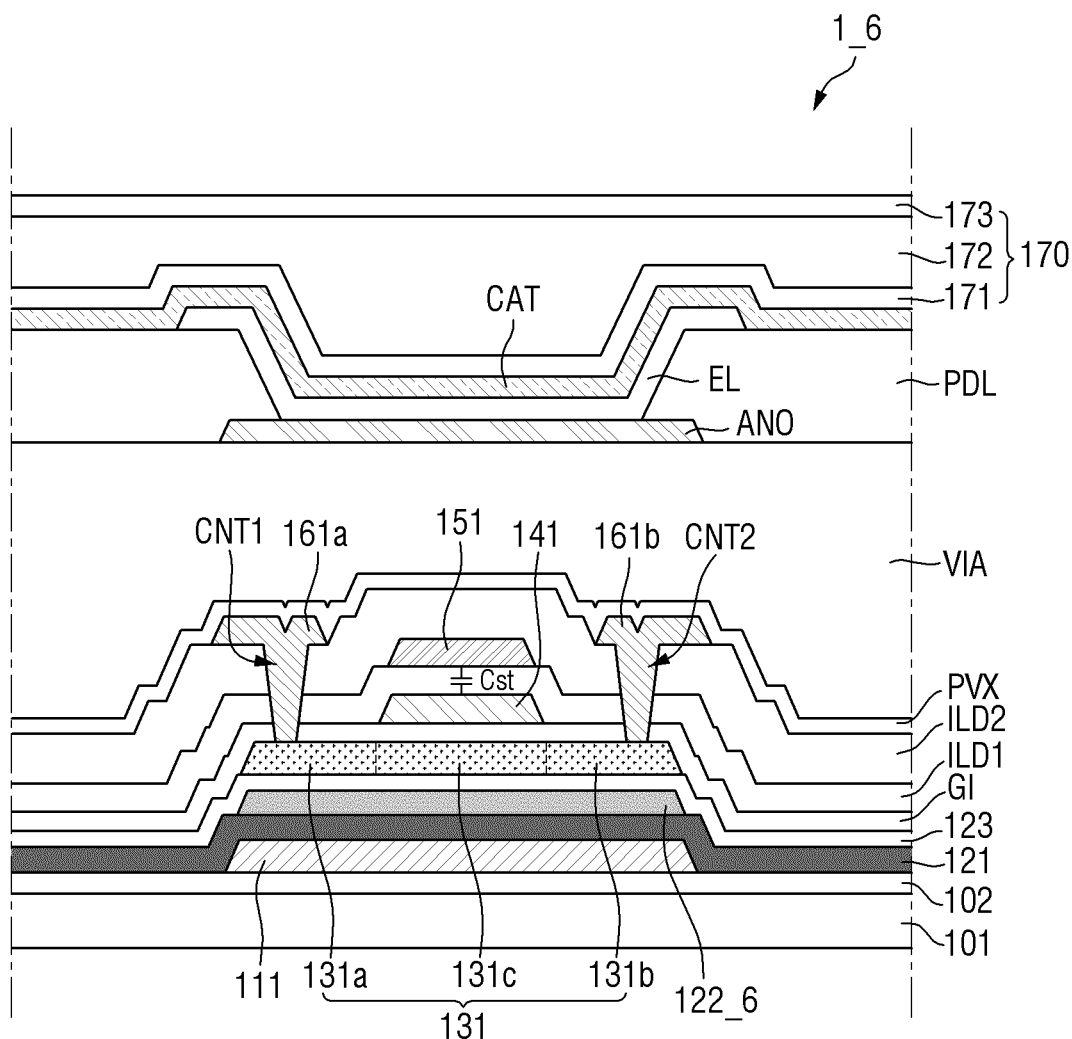
FIG. 22 is a schematic cross-sectional view of a display device according to yet another embodiment of the disclosure.

FIG. 22 is a schematic cross-sectional view of a display device according to yet another embodiment of the disclosure.

The embodiment of FIG. 22 is substantially identical to the embodiment of FIG. 4 except that a second buffer film 122_6 of a buffer layer 120_6 is disposed only in some regions in a display device 1_6.

A buffer layer 120_6 according to this embodiment may include a first buffer film 121, a second buffer film 122_6, and a third buffer film 123. The first buffer film 121 and the third buffer film 123 are disposed over the entire area of the barrier layer 102, whereas the second buffer film 122_6 is disposed only in some areas. The second buffer film 122_6 may overlap at least the channel region 131c of the semiconductor pattern 131.

Although not limited thereto, for example, the second buffer film 122_6 may be formed in a pattern substantially the same as the shape of the semiconductor pattern 131 in a plan view. The entire area of the semiconductor pattern 131 and the bottom light-blocking pattern 111 may overlap the second buffer film 122_6.

In this case, as the second buffer film 122_6 having a small density is disposed, it is possible to suppress or prevent hydrogen (H$_2$) from flowing into the channel region 131c of the semiconductor pattern 131. Therefore, it is possible to suppress or prevent a short channel effect of the channel region 131c, thereby suppressing or preventing defects in switching characteristic of the second transistor TR2. As the second buffer film 122_6 is disposed only in some regions, the material forming the second buffer film 122_6 may be reduced, thereby saving the process cost.

In concluding the detailed description, those skilled in the art will appreciate that many variations and modifications can be made to the above-described embodiments without substantially departing from the principles of the disclosure. Therefore, the disclosed preferred embodiments of the disclosure are used in a generic and descriptive sense only and not for purposes of limitation.

What is claimed is:

1. A display device comprising:
   a first buffer film including silicon nitride (SiN$_x$) and disposed on a substrate;
   a second buffer film including silicon nitride (SiN$_x$) and disposed on the first buffer film;
   a third buffer film including silicon oxide (SiO$_x$) and disposed on the second buffer film; and
   a semiconductor pattern including an oxide semiconductor and disposed on the third buffer film, and
   wherein a density of the first buffer film is greater than a density of the second buffer film.

2. The display device of claim 1, wherein a thickness of the first buffer film is substantially equal to a thickness of the second buffer film.

3. The display device of claim 1, wherein the density of the second buffer film is equal to or less than about 2.5 g/cm$^3$.

4. The display device of claim 1, further comprising:
   a fourth buffer film including silicon nitride (SiN$_x$) and disposed between the first buffer film and the second buffer film, and
   wherein a density of the fourth buffer film gradually decreases from the first buffer film toward the second buffer film.

5. The display device of claim 1, further comprising:
   a gate insulating layer disposed on the semiconductor pattern; and
   a gate electrode disposed on the gate insulating layer, and
   wherein the semiconductor pattern includes:
   a channel region overlapping the gate electrode in a thickness direction of the substrate;
   a source region extending from one side of the channel region; and
   a drain region extending from other side of the channel region, and
   wherein the source region and the drain region do not overlap the gate electrode in the thickness direction of the substrate.

6. The display device of claim 1, further comprising:
   a light-blocking pattern between the substrate and the first buffer film.

7. The display device of claim 1, wherein the second buffer film is disposed on a portion of the first buffer film.

8. The display device of claim 7, wherein the second buffer film fully overlaps the semiconductor pattern in a thickness direction of the substrate.

9. The display device of claim 1, wherein a value of [N—H]/[Si—H] of the first buffer film is greater than a value of [N—H]/[Si—H] of the second buffer film, and
   wherein the value of [N—H]/[Si—H] of the first buffer film and the value of [N—H]/[Si—H] of the second buffer film are measured by a Fourier-transform infrared spectrometer (FT-IR spectrometer).

10. The display device of claim 9, wherein the value of [N—H]/[Si—H] of the first buffer film is five or more times the value of [N—H]/[Si—H] of the second buffer film.

11. The display device of claim 9, wherein the value of [N—H]/[Si—H] of the second buffer film is in a range of about 1.3 to about 3.0.

12. A display device comprising:
a first buffer film including silicon nitride ($SiN_x$) and disposed on a substrate;
a second buffer film including silicon oxide ($SiO_x$) and disposed on the first buffer film; and
a semiconductor pattern including an oxide semiconductor and disposed on the second buffer film, wherein
a density of the first buffer film is greater than that of the second buffer film, and
a thickness of the second buffer film is within a range of about 70 nm to about 90 nm.

13. The display device of claim 12, wherein the semiconductor pattern is in contact with the second buffer film.

14. The display device of claim 12, further comprising:
a light-blocking pattern between the substrate and the first buffer film, wherein
the first buffer film is contact with the light-blocking pattern.

15. A display device comprising:
a first buffer film including silicon nitride ($SiN_x$) and disposed on a substrate;
a plurality of second buffer films including silicon oxide ($SiO_x$), wherein the first buffer film is disposed on one of the plurality of second buffer films;
a third buffer film including silicon oxide ($SiO_x$) and disposed on other one of the plurality of second buffer films; and
a semiconductor pattern including an oxide semiconductor and disposed on the third buffer film, and
wherein a density of the first buffer film is greater than a density of each of the plurality of second buffer films.

16. The display device of claim 15, further comprising:
a light-blocking pattern between the substrate and the other one of the plurality of second buffer films.

17. A display device comprising:
a first buffer film including silicon nitride ($SiN_x$) and disposed on a substrate;
a second buffer film including silicon nitride ($SiN_x$) and disposed on the first buffer film;
a third buffer film including silicon oxide ($SiO_x$) and disposed on the second buffer film; and
a semiconductor pattern including an oxide semiconductor and disposed on the second buffer film, and
wherein a density of the first buffer film gradually decreases from the substrate toward the second buffer film.

18. The display device of claim 17, further comprising:
a fourth buffer film including silicon nitride ($SiN_x$) and disposed between the substrate and the first buffer film, and
wherein a density of the fourth buffer film is greater than a density of the second buffer film.

19. A display device comprising:
a buffer layer disposed on a substrate and including a first buffer film and a second buffer film sequentially stacked in a thickness direction of the substrate;
a transistor including a semiconductor pattern disposed on the buffer layer and a gate electrode overlapping a portion of the semiconductor pattern in the thickness direction of the substrate; and
a gate insulating layer between the semiconductor pattern and the gate electrode, and
wherein the first buffer film and the second buffer film comprise a same material, and
wherein a density of the first buffer film is greater than a density of the second buffer film.

20. The display device of claim 19, wherein the buffer layer further comprises a third buffer film comprising different material from the first buffer film and the second buffer film, and
the third buffer film is disposed on the first buffer film and the second buffer film.

21. The display device of claim 19, wherein:
the first buffer film is disposed on the substrate;
the second buffer film is disposed on the first buffer film; and
the semiconductor pattern is disposed on the second buffer film.

22. The display device of claim 21, wherein a thickness of the first buffer film is substantially equal to a thickness of the second buffer film.

23. The display device of claim 19, wherein:
the second buffer film is disposed on the substrate;
the first buffer film is disposed on the second buffer film; and
the semiconductor pattern is disposed on the first buffer film.

24. The display device of claim 23, wherein a thickness of the first buffer film is greater than a thickness of the second buffer film.

* * * * *